(12) United States Patent
Kim

(10) Patent No.: US 12,074,705 B2
(45) Date of Patent: Aug. 27, 2024

(54) METHOD AND APPARATUS FOR DRIVING PDCP DURING DATA DECOMPRESSION FAILURE IN NEXT-GENERATION MOBILE COMMUNICATION SYSTEM

(71) Applicant: Samsung Electronics Co., Ltd., Suwon-si (KR)

(72) Inventor: Donggun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/783,878

(22) PCT Filed: Nov. 26, 2020

(86) PCT No.: PCT/KR2020/016979
§ 371 (c)(1),
(2) Date: Jun. 9, 2022

(87) PCT Pub. No.: WO2021/125610
PCT Pub. Date: Jun. 24, 2021

(65) Prior Publication Data
US 2023/0025610 A1    Jan. 26, 2023

(30) Foreign Application Priority Data

Dec. 16, 2019 (KR) .......... 10-2019-0167761

(51) Int. Cl.
*H04L 1/00* (2006.01)
*H04L 1/1867* (2023.01)
*H04W 28/02* (2009.01)

(52) U.S. Cl.
CPC .......... *H04L 1/0072* (2013.01); *H04L 1/1874* (2013.01); *H04W 28/0278* (2013.01)

(58) Field of Classification Search
CPC ..... H04L 1/0072; H04L 1/1874; H04L 1/001; H04L 1/0073; H04L 1/004; H04L 1/1877; H04W 28/0278
See application file for complete search history.

(56) References Cited

U.S. PATENT DOCUMENTS 10,542,457 B2   1/2020   Maheshwari et al.
11,202,227 B2   12/2021  Liu et al.
(Continued)

FOREIGN PATENT DOCUMENTS

CN    107534661 A    1/2018
CN    109802922 A    5/2019
(Continued)

OTHER PUBLICATIONS

LG Electronics Inc., "Discard indication for UDC," R2-1909879, 3GPP TSG-RAN WG2 #107, Prague, Czech Republic, Aug. 15, 2019.
(Continued)

Primary Examiner — Ian N Moore
Assistant Examiner — Brian T Le
(74) Attorney, Agent, or Firm — Jefferson IP Law, LLP

(57) ABSTRACT

Disclosed are a communication technique which merges, with IoT technology, a 5G communication system for supporting a data transmission rate higher than that of a 4G system, and a system therefor. The present disclosure can be applied to intelligent services (for example, smart homes, smart buildings, smart cities, smart cars or connected cars, healthcare, digital education, retail, security- and safety-related services, and the like) on the basis of 5G communication technology and IoT-related technology. Disclosed are a method and apparatus for driving a PDCP layer apparatus during data decompression failure in a next-generation mobile communication system.

11 Claims, 15 Drawing Sheets

(56) References Cited

U.S. PATENT DOCUMENTS

| | | | |
|---|---|---|---|
| 2016/0337255 | A1 | 11/2016 | Balasubramanian et al. |
| 2019/0141567 | A1 | 5/2019 | Liu et al. |
| 2019/0141571 | A1 | 5/2019 | Kim et al. |
| 2020/0344644 | A1* | 10/2020 | Liu .................. H04L 69/04 |
| 2021/0185560 | A1* | 6/2021 | Shreevastav ...... H04W 28/0236 |

FOREIGN PATENT DOCUMENTS

| | | |
|---|---|---|
| CN | 110073643 A | 7/2019 |
| EP | 3 665 973 B1 | 6/2020 |
| KR | 10-2018-0084605 A | 7/2018 |
| KR | 10-2019-0053066 A | 5/2019 |
| WO | 2019/093961 A1 | 5/2019 |
| WO | 2019/103558 A1 | 5/2019 |

OTHER PUBLICATIONS

Huawei etc., "Further discussion on the Ethernet header compression solutions," R2-1901417, 3GPP TSG-RAN WG2 # 105, Athens, Greece, Feb. 14, 2019.
Samsung, "Leftover issues for EHC," R2-2002908, 3GPP TSG RAN WG2 Meeting #109bis-e, e-Meeting, Apr. 20-30, 2020.
LG Electronics Inc., "Discard indication for UDC", 3GPP TSG-RAN WG2 #107 R2-1909880, Prague, Czech Republic , Aug. 26-30, 2019.
3rd Generation Partnership Project; Technical Specification Group Radio Access Network; Evolved Universal Terrestrial Radio Access (E-UTRA); Packet Data Convergence Protocol (PDCP) specification (Release 15), 3GPP TS 36.323 V15.4.0 (Jun. 2019).
European Search Report dated Dec. 2, 2022, issued in European Application No. 20902514.7.
European Search Report dated Jan. 2, 2024; European Application No. 20 902 514.7-1213.
Chinese Office Action eith English translation dated Jun. 27, 2024; Chinese Appln. No. 2022080096059.9.

* cited by examiner

METHOD AND APPARATUS FOR DRIVING PDCP DURING DATA DECOMPRESSION FAILURE IN NEXT-GENERATION MOBILE COMMUNICATION SYSTEM

TECHNICAL FIELD

The disclosure relates to a method and an apparatus for driving a PDCP layer device during a data decompression failure in a next-generation mobile communication system.

BACKGROUND ART

To meet the demand for wireless data traffic having increased since deployment of 4G communication systems, efforts have been made to develop an improved 5G or pre-5G communication system. Therefore, the 5G or pre-5G communication system is also called a "beyond 4G network" communication system or a "post LTE" system. The 5G communication system is considered to be implemented in ultrahigh frequency (mmWave) bands (e.g., 60 GHz bands) so as to accomplish higher data rates. To decrease propagation loss of the radio waves and increase the transmission distance in the ultrahigh frequency bands, beamforming, massive multiple-input multiple-output (massive MIMO), full dimensional MIMO (FD-MIMO), array antenna, analog beam forming, large scale antenna techniques are discussed in 5G communication systems. In addition, in 5G communication systems, development for system network improvement is under way based on advanced small cells, cloud radio access networks (cloud RANs), ultra-dense networks, device-to-device (D2D) communication, wireless backhaul, moving network, cooperative communication, coordinated multi-points (CoMP), reception-end interference cancellation and the like. In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have also been developed.

The Internet, which is a human centered connectivity network where humans generate and consume information, is now evolving to the Internet of things (IoT) where distributed entities, such as things, exchange and process information without human intervention. The Internet of everything (IoE), which is a combination of the IoT technology and the big data processing technology through connection with a cloud server, has emerged. As technology elements, such as "sensing technology", "wired/wireless communication and network infrastructure", "service interface technology", and "security technology" have been demanded for IoT implementation, a sensor network, a machine-to-machine (M2M) communication, machine type communication (MTC), and so forth have been recently researched. Such an IoT environment may provide intelligent Internet technology (IT) services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, machine type communication (MTC), and machine-to-machine (M2M) communication may be implemented by beamforming, MIMO, and array antennas. Application of a cloud radio access network (cloud RAN) as the above-described big data processing technology may also be considered an example of convergence of the 5G technology with the IoT technology.

In a next-generation mobile communication system, a downlink may secure more transmission resources by using a high frequency band and using a broad bandwidth. In addition, a base station can install and use more antennas physically, thereby obtaining a beamforming gain and a high signal strength, such that more data can be loaded onto the same frequency/time resource and transmitted to a UE through the downlink. However, in the case of an uplink, the UE has a physically small size, in the case of the uplink frequency, it is difficult to use a high frequency band and a broad bandwidth, and a bottleneck phenomenon is therefore more likely to occur in the uplink transmission resource than in the downlink transmission resource. Moreover, the maximum transmission power of the UE is far smaller than that of the base station, which causes a problem in that the coverage is smaller during uplink data transmission. Therefore, there is a need to efficiently use transmission resources by compressing uplink data.

Uplink data is compressed by performing successive data compression based on previous data. Therefore, if a piece of data in the middle of a series of pieces of compressed data is missing, is discarded, or fails to be decompressed, all data following the data that is missing, is discarded, or fails to be decompressed undergoes a data decompression failure.

A transmitting-terminal PDCP layer device may drive a PDCP discarding timer with regard to each piece of data every time data is received from an upper layer device. if an uplink compression procedure has been configured, the uplink compression procedure may be applied to data supposed to undergo the uplink compression procedure based on context of a transmitting UDC buffer. A checksum field may be calculated based on the transmitting UDC buffer context, thereby obtaining a checksum field value. An indicator may be configured so as to indicate whether UDC is applied, and may be configured for a UDC header. The transmitting UDC buffer may be updated based on raw data prior to application of compression to the data to which the compression procedure has been applied. In addition, the data that has undergone uplink data compression may be encrypted, a PDCP serial number may be assigned thereto, a PDCP header may be configured, and a PDCP PDU may be generated and transmitted.

A receiving-terminal PDCP layer device may rearrange pieces of received data according to the PDCP serial number or COUNT value. Alternatively, an RLC layer device may rearrange pieces of received data according to the RLC serial number and may deliver the same to the receiving-terminal PDCP layer device. The receiving-terminal PDCP layer device may then use the indicator of the UDC header so as to identify whether a user data compression procedure (uplink data compression (UDC)) has been applied with regard to each piece of data (for example, PDCP PDU or PDCP SDU). Based on the checksum field of the UDC header, the same may identify whether context of the transmitting UDC buffer and that of the currently receiving UDC buffer are synchronized or identical. If it is identified as a result of calculating the checksum field value that context of the transmitting UDC buffer and that of the currently receiving UDC buffer are not synchronized or different, a checksum failure or decompression error occurs. PDCP control data may be transmitted to the transmission terminal to indicate that a checksum failure or decompression error has occurred.

Upon receiving the PDCP control data (feedback regarding checksum failure), the transmitting-terminal PDCP layer device may initialize the transmitting-terminal UDC buffer and may newly apply UDC compression to pieces of new data or pieces of data which have not been transmitted, but to which UDC compression has already been applied. However, if the receiving-terminal PDCP layer device receives pieces of data which have already been generated by the transmitting-terminal PDCP layer device through data processing before the PDCP control data is received, or which have already been delivered to a lower layer device, another checksum failure or error will occur. Alternatively, pieces of data including no indicator indicating that the transmitting UDC buffer has been initialized will be discarded. As a result, transmission resources may be wasted by unnecessary data transmission described above.

DISCLOSURE OF INVENTION

Technical Problem

Therefore, it is an aspect of the disclosure to propose efficient transmitting-terminal PDCP layer device operations or receiving-terminal PDCP layer device operations for preventing unnecessary data transmission with regard to a checksum failure that may occur during the user data compression or decompression procedure.

Solution to Problem

In order to solve the above-mentioned problems, a method performed by a transmission device in a wireless communication system according to an embodiment of the disclosure may include: transmitting, to a reception device, first data compressed based on uplink data compression (UDC); receiving, from the reception device, an indicator indicating a checksum failure for decompression of the transmitted first data a; initializing a UDC buffer based on the indicator; and discarding data which is preprocessed before initialization of the UDC buffer.

In addition, a method performed by a reception device in a wireless communication system according to an embodiment of the disclosure may include:
receiving, from a transmission device, first data; performing decompression of the first data based on uplink data compression (UDC); in case that a checksum failure occurs while performing the decompression, transmitting, to the transmission device, an indicator indicating the checksum failure; and initializing a UDC buffer of the reception device based on the transmission of the indicator, wherein data which is preprocessed by the transmission device based on a UDC buffer is discarded based on the indicator, the UDC buffer being applied for compression of the first data.

In addition, a transmission device in a wireless communication system according to an embodiment of the disclosure may include: a transceiver; and a controller configured to: control the transceiver to transmit, to a reception device first data compressed based on uplink data compression (UDC); control the transceiver to receive, from the reception device, an indicator indicating a checksum failure for decompression of the transmitted first dat; initialize a UDC buffer based on the indicator; and discard data which is preprocessed before initialization of the UDC buffer.

In addition, a reception device in a wireless communication system according to an embodiment of the disclosure may include: a transceiver; and a controller configured to: control the transceiver to receive, from a transmission device, first data; perform decompression of the first data based on uplink data compression (UDC); in case that a checksum failure occurs during performance of the decompression, control the transceiver to transmit, to the transmission device, an indicator indicating the checksum failure; and initialize a UDC buffer of the reception device based on the transmission of the indicator, wherein data which is preprocessed by the transmission device based on a UDC buffer is discarded based on the indicator, the UDC buffer being applied for compression of the first data.

Advantageous Effects of Invention

The disclosure proposes a procedure wherein, when a transmitting PDCP layer device (UE or base station) transmits data through an uplink or downlink in a wireless communication system, the data is compressed and transmitted, and a receiving PDCP layer device (base station or UE) receives and decompresses the same. More particularly, the disclosure proposes a method for supporting a data transmission/reception procedure wherein a transmission terminal compresses and transmits data, and a reception terminal decomposes the same, such as a method for solving a problem related to a header format decompression failure, and a method for solving a problem related to discarding by a PDCP discarding timer in a transmitting PDCP layer device.

In addition, the method is also applicable to a procedure wherein, when a base station transmits downlink data to a UE, the data is compressed and transmitted, and the UE receives and decompresses the compressed downlink data. An embodiment of the disclosure, as described above, is advantageous in that the transmission terminal compresses and transmits data such that more data can be transmitted, and the coverage is also improved.

In addition, the disclosure proposes efficient transmitting-terminal PDCP layer operations or receiving-terminal PDCP layer operations for preventing unnecessary data transmission in connection with a checksum failure that may occur in the user data compression or decompression procedure, thereby reducing unnecessary transmission resource waste and unnecessary data processing.

MODE FOR THE INVENTION

Hereinafter, the operation principle of the disclosure will be described in detail with reference to the accompanying drawings. In the following description of the disclosure, a detailed description of known functions or configurations incorporated herein will be omitted when it is determined that the description may make the subject matter of the disclosure unnecessarily unclear. The terms which will be described below are terms defined in consideration of the functions in the disclosure, and may be different according to users, intentions of the users, or customs. Therefore, the definitions of the terms should be made based on the contents throughout the specification.

In describing the disclosure below, a detailed description of known functions or configurations incorporated herein will be omitted when it is determined that the description may make the subject matter of the disclosure unnecessarily unclear. Hereinafter, embodiments of the disclosure will be described in detail with reference to the accompanying drawings.

In the following description, terms for identifying access nodes, terms referring to network entities, terms referring to messages, terms referring to interfaces between network entities, terms referring to various identification information, and the like are illustratively used for the sake of convenience. Therefore, the disclosure is not limited by the terms as used below, and other terms referring to subjects having equivalent technical meanings may be used.

In the following description, the disclosure will be described using terms and names defined in the 1rd generation partnership project long term evolution (1gPP LTE) standards for the convenience of description. However, the disclosure is not limited by these terms and names, and may be applied in the same way to systems that conform other standards. In the disclosure, the term "eNB" may be interchangeably used with the term "gNB". That is, a base station described as "eNB" may indicate "gNB".

Figure 1:
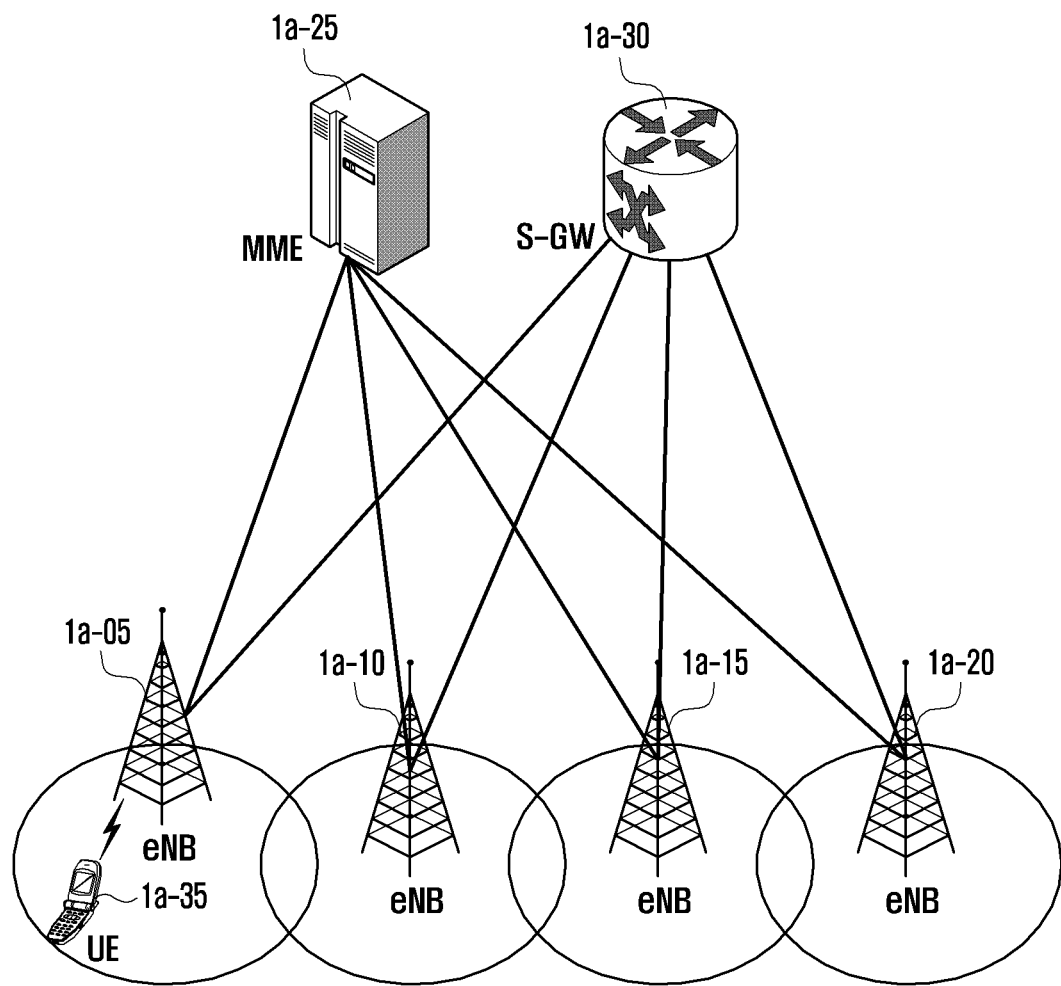
FIG. 1 illustrates the structure of an LTE system to which the disclosure can be applied.

FIG. 1 illustrates the structure of an LTE system to which the disclosure can be applied.

Referring to FIG. 1, a radio access network of an LTE system may include next-generation base stations (referred to as evolved node Bs, hereinafter eNBs, node Bs, or base stations) 1a-05, 1a-10, 1a-15, and 1a-20, a mobility management entity (MME) 1a-25, or a serving gateway (S-GW) 1a-30. A user equipment (hereinafter UE or terminal) 1a-35 may access an external network through the eNBs 1a-05 to 1a-20 or S-GW 1a-30.

In FIG. 1, the eNBs 1a-05 to 1a-20 may correspond to an existing node B of a UMTS system. The eNBs are connected to the UE 1a-35 through a radio channel, and perform a more complicated role than the existing node B. In the LTE system, since all user traffic pertaining to real-time service, such as voice over IP (VoIP), via the Internet protocol, is serviced through a shared channel, a device that performs scheduling by collecting state information, such as buffer states, available transmit power states, and channel states of UEs, is required, and eNBs 1a-05 to 1a-20 may be in charge of the scheduling of the device. One eNB controls multiple cells. For example, in order to implement a transmission rate of 100 Mbps, the LTE system uses orthogonal frequency division multiplexing (hereinafter, referred to as OFDM) as a radio access technology in the bandwidth of 20 MHz. In addition, the LTE system adopts an adaptive modulation & coding (hereinafter, referred to as AMC) scheme for determining a modulation scheme and a channel coding rate based on the channel state of the UE. The S-GW 1a-30 is a device for providing a data bearer, and may generate or remove a data bearer under the control of the MME 1a-25. The MME is in charge of various control functions in addition to a mobility management function for the UE, and is connected to multiple base stations.

Figure 2:
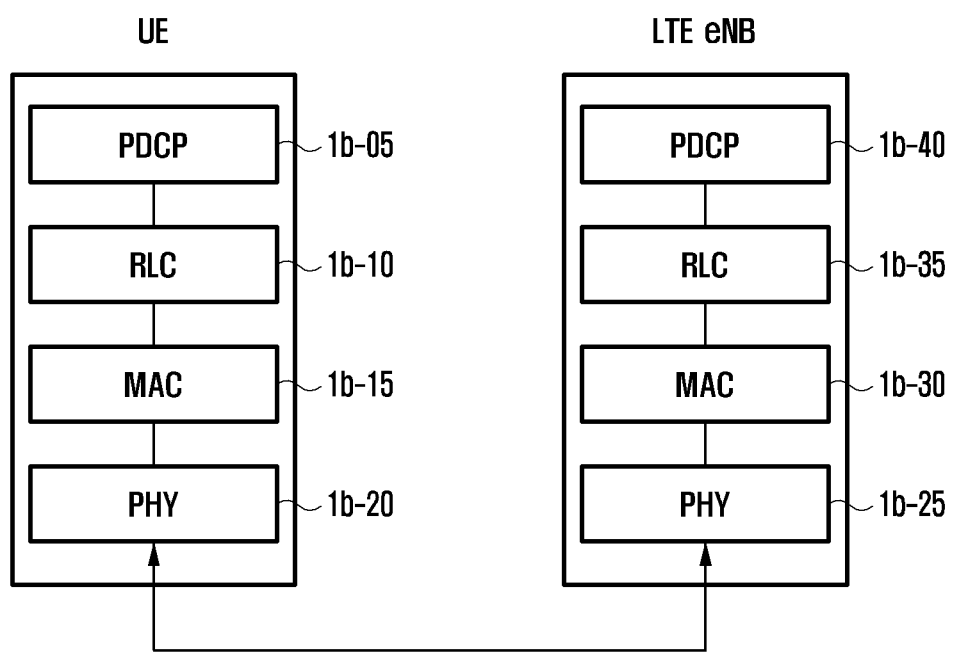
FIG. 2 illustrates a radio protocol structure in an LTE system to which the disclosure can be applied.

FIG. 2 illustrates a radio protocol structure in an LTE system to which the disclosure can be applied.

Referring to FIG. 2, the radio protocol of the LTE system includes packet data convergence protocols (PDCPs) 1b-05 and 1b-40, radio link controls (RLCs) 1b-10 and 1b-35, and medium access controls (MACs) 1b-15 and 1b-30, in a UE and an eNB, respectively. The packet data convergence protocols (PDCPs) 1b-05 and 1b-40 are used to perform operations, such as IP header compression/reconstruction. The main functions of PDCPs are summarized as follows.

Header compression and decompression: ROHC only

Transfer of user data

In-sequence delivery of upper layer PDUs at PDCP re-establishment procedure for RLC AM Sequence reordering (for split bearers in DC (only support for RLC AM): PDCP PDU routing for transmission and PDCP PDU reordering for reception)

Duplicate detection of lower layer SDUs at PDCP re-establishment procedure for RLC AM Retransmission of PDCP SDUs at handover and, for split bearers in DC, of PDCP PDUs at PDCP data-recovery procedure, for RLC AM)

Ciphering and deciphering

Timer-based service data unit (SDU) discard in uplink

The radio link control (hereinafter referred to as RLC) 1b-10 and 1b-35 may perform an ARQ operation and the like by reconfiguring a PDCP protocol data unit (PDU) to an appropriate size. The main functions of RLC are summarized below.

Transfer of upper layer PDUs

ARQ function (Error correction through ARQ (only for AM data transfer))—Concatenation, segmentation and reassembly of RLC SDUs (only for UM and AM data transfer)

Re-segmentation of RLC data PDUs (only for AM data transfer)

Reordering of RLC data PDUs (only for UM and AM data transfer)

Duplicate detection (only for UM and AM data transfer)

Protocol error detection (only for AM data transfer)

RLC SDU discard (only for UM and AM data transfer)

RLC re-establishment

The MACs 1b-15 and 1b-30 are connected to multiple RLC layer devices configured in one UE, and may perform an operation of multiplexing RLC (PDUs to MAC PDUs and de-multiplexing RLC PDUs from MAC PDUs. The main functions of MAC are summarized as follows.

Mapping between logical channels and transport channels

Multiplexing/de-multiplexing of MAC SDUs belonging to one or different logical channels into/from transport blocks (TB) delivered to/from the physical layer on transport channels Scheduling information reporting Error correction through HARQ Priority handling between logical channels of one UE Priority handling between UEs by means of dynamic scheduling Multimedia broadcast multicast service (MBMS) identification Transport format selection Padding Physical layers 1b-20 and 1b-25 may perform operations of channel coding and modulating upper layer data, forming the upper layer data into an OFDM symbol, transmitting the OFDM symbol through a radio channel, or of demodulating an OFDM symbol received through a radio channel, channel-decoding the OFDM symbol, and transmitting the OFDM symbol to an upper layer.

Figure 3:
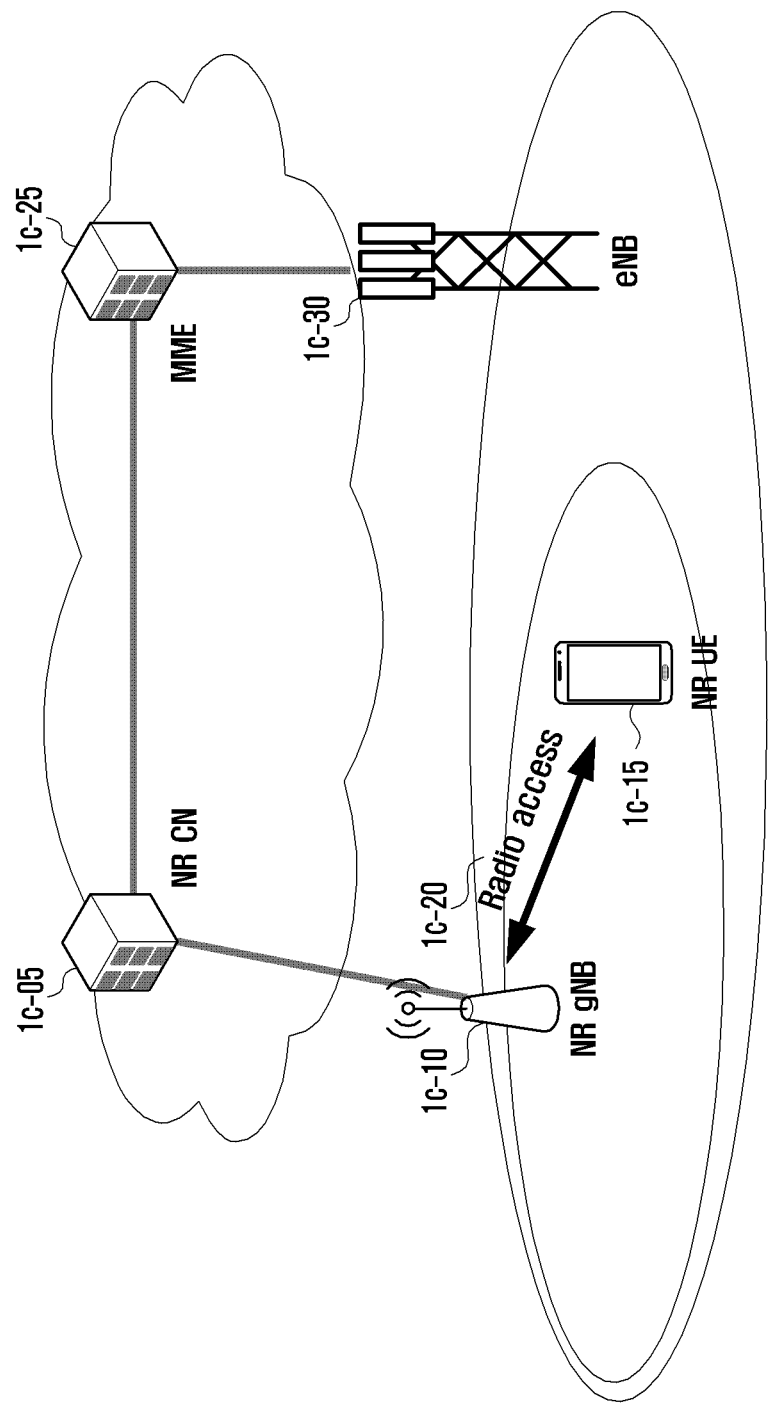
FIG. 3 illustrates the structure of a next-generation mobile communication system to which the disclosure can be applied.

FIG. 3 illustrates the structure of a next-generation mobile communication system to which the disclosure can be applied.

Referring to FIG. 3, a radio access network of a next-generation mobile communication system (hereinafter referred to as NR or 5G) may include a new radio node B (hereinafter referred to as an NR gNB, or NR base station) 1c-10 and a new radio core network (NR CN) 1c-05. A user equipment (a new radio user equipment, hereinafter referred to as NR UE or a terminal) 1c-15 may access an external network via an NR gNB 1c-10 and an NR CN 1c-05.

In FIG. 3, the NR gNB 1c-10 corresponds to an evolved node B (eNB) of the existing LTE system. The NR gNB 1c-10 is connected to an NR UE 1c-15 via a radio channel, and may provide an excellent service as compared to the existing node B. In a next-generation mobile communication system, since all types of user traffic is serviced through a shared channel, there is a need for a device for performing scheduling by collecting state information, such as buffer states, available transmission power states, and channel states of UEs. Further, the NR gNB 1c-10 is in charge of the scheduling of the device. One NR gNB typically controls multiple cells. In order to implement ultra-high speed data transmission as compared to the current LTE, the NR gNB may have the existing maximum bandwidth or more, and may additionally employ beamforming technology using orthogonal frequency division multiplexing (hereinafter referred to as OFDM) as a radio access technology. In addition, the NR gNB adopts an adaptive modulation & coding (AMC) scheme that determines a modulation scheme and a channel coding rate based on the channel state of a UE.

The NR CN 1c-05 performs functions, such as mobility support, bearer configuration, QoS configuration, and the like. The NR CN is a device that is in charge of various control functions in addition to a mobility management function for a UE, and may be connected to multiple base stations. In addition, the next-generation mobile communication system may also operate in conjunction with the existing LTE system, and the NR CN may be connected to an MME 1c-25 via a network interface. The MME may be connected to an eNB 1c-30, that is, to the existing base station.

Figure 4:
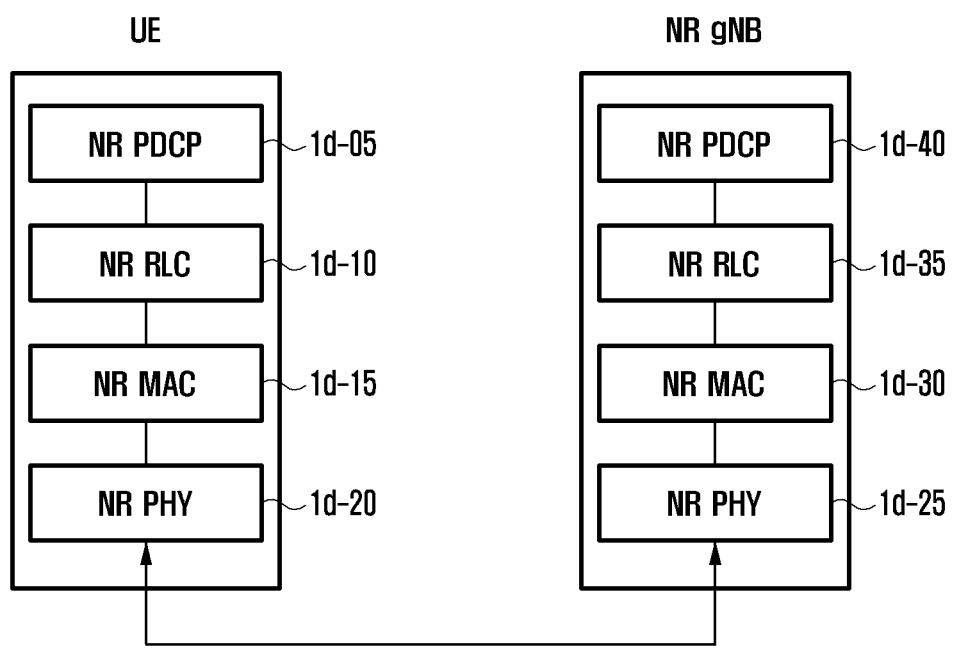
FIG. 4 illustrates a radio protocol structure of a next-generation mobile communication system to which the disclosure can be applied.

FIG. 4 illustrates a radio protocol structure of a next-generation mobile communication system to which the disclosure can be applied.

Referring to FIG. 4, the radio protocol of the next-generation mobile communication system includes NR PDCPs 1d-05 and 1d-40, NR RLCs 1d-10 and 1d-35, and NR MACs 1d-15 and 1d-30, in a UE and an NR base station, respectively. The main functions of the NR PDCPs 1d-05 and 1d-40 may include some of the following functions.

Header compression and decompression: ROHC only

Transfer of user data

In-sequence delivery of upper layer PDUs

Out-of-sequence delivery of upper layer PDUs

Sequence reordering (PDCP PDU reordering for reception)

Duplicate detection of lower layer SDUs

Retransmission of PDCP SDUs

Ciphering and deciphering

Timer-based SDU discard in uplink

In the above, the reordering function of the NR PDCP device may include a function of sequentially reordering PDCP PDUs, received from a lower layer, based on a PDCP sequence number (SN), and a function of transmitting data to an upper layer in the reordered sequence. Alternatively, the reordering function of the NR PDCP device may include a function of directly transmitting data to an upper layer without taking the sequence into consideration, a function of reordering the sequence and recording lost PDCP PDUs, a function of providing a state report on the lost PDCP PDUs to a transmission side, and a function of requesting retransmission of the lost PDCP PDUs.

The main functions of the NR RLCs 1d-10 and 1d-35 may include some of the following functions.

Transfer of upper layer PDUs

In-sequence delivery of upper layer PDUs

Out-of-sequence delivery of upper layer PDUs

Error Correction through ARQ

Concatenation, segmentation and reassembly of RLC SDUs

Re-segmentation of RLC data PDUs

Reordering of RLC data PDUs

Duplicate detection

Protocol error detection

RLC SDU discard

RLC re-establishment

In the above, the in-sequence delivery (or ID) function of the NR RLC device refers to a function of transmitting RLC SDUs, received from a lower layer, to an upper layer in sequence. The in-sequence delivery function of the NR RLC device may include, when one RLC SDU is originally segmented into multiple RLC SDUs and received, a function of reassembling and transmitting the multiple RLC SDUs, a function of reordering the received RLC PDUs based on an RLC sequence number (SN) or PDCP sequence number (SN), a function of reordering the sequence and recording lost RLC PDUs, a function of providing a state report on the lost RLC PDUs to a transmission side, a function of requesting retransmission of the lost RLC PDUs, a function of sequentially transmitting only RLC SDUs prior to the lost RLC SDU to an upper layer when there is a lost RLC SDU, a function of sequentially transmitting all the RLC SDUs received before a predetermined timer starts to an upper layer when the predetermined timer has expired even if there is a lost RLC SDU, or a function of sequentially transmitting all RLC SDUs received so far to an upper layer when the predetermined timer has expired even when there is a lost RLC SDU. Further, in the above, the RLC PDUs may be processed in a sequence in which the RLC PDUS are received (a sequence number, regardless of the sequence of sequence numbers, or in a sequence of arrival), and may be transmitted to a PDCP device in out-of-sequence delivery. The function may include receiving segments stored in a buffer or segments to be received later, reconfiguring the segments in one complete RLC PDU, processing the RLC PDU, and transmitting the RLC PDU to the PDCP device. The NR RLC layer may not include a concatenation function, and the concatenation function may be performed by the NR MAC layer, or may be replaced by a multiplexing function of the NR MAC layer.

The out-of-sequence delivery function of the NR RLC device may include a function of directly transmitting the RLC SDUs, received from the lower layer, to an upper layer regardless of the sequence thereof. The out-of-sequence delivery function of the RLC device may include, when one RLC SDU has been originally segmented into multiple RLC SDUs and received, a function of reassembling the multiple RLC SDUs and transmitting the same, and a function of storing the RLC SN or PDCP SN of the received RLC PDUs, ordering the sequence, and recording the lost RLC PDUs.

The NR MACs 1d-15 and 1d-30 may be connected to multiple NR RLC layer devices configured in one UE, and the main function of the NR MAC may include some of the following functions.

Mapping between logical channels and transport channels
Multiplexing/de-multiplexing of MAC SDUs
Scheduling information reporting
Error correction through HARQ
Priority handling between logical channels of one UE
Priority handling between UEs by means of dynamic scheduling
MBMS service identification
Transport format selection
Padding The NR PHY layers 1d-20 and 1d-25 may perform operations of channel-coding and modulating upper layer data, forming the upper layer data into an OFDM symbol, transmitting the OFDM symbols via a radio channel or demodulating and channel decoding of the OFDM symbols received via the radio channel, and transferring the OFDM symbol to an upper layer.

The disclosure proposes a procedure in which a UE compresses data during transmission of the data through an uplink and a base station decompresses the compressed data in a wireless communication system, and proposes a method for supporting, such as a detailed header format and resolution when a decompression failure occurs, a data transmission/reception procedure in which a transmission terminal compresses and transmits data and a reception terminal decompresses the data. In addition, the method proposed in the disclosure may also be applied to a procedure in which a base station compresses and transmits downlink data during transmission of downlink data to a UE, and the UE receives and decompresses the compressed downlink data. As described above, in the disclosure, the transmission terminal compresses and transmits data, so that more data can be transmitted and at the same time, coverage enhancement can be expected.

A user data compression method (uplink data compression or UDC compression method) or an uplink data compression method is a method of performing data compression successively based on previous data. Therefore, if one data is lost or discarded among the series of compressed data, or if decompression failure occurs, decompression is to be failed with regard to all data after the lost or discarded data, or data for which decompression has failed.

The procedure of the user data compression method is performed by the transmission terminal PDCP layer device. Specifically, the transmission terminal PDCP layer device may drive a PDCP discard timer for each data each time data is received from an upper layer device, and if an uplink compression procedure is configured, the transmission terminal PDCP layer device may apply an uplink compression procedure to data to be subjected to an uplink compression procedure based on the context of the transmission UDC buffer, may calculate a checksum field based on the transmission UDC buffer context to obtain a checksum field value, may configure an indicator indicating whether or not to apply the UDC and configure the indicator in the UDC header, and may update the transmission UDC buffer based on raw data before compression is applied to the data to which the compression procedure is applied. In addition, the transmission terminal PDCP layer device may generate a PDCP PDU by performing encoding of the data for which the uplink data compression has been performed, allocating a PDCP sequence number thereto, and configuring a PDCP header, and may transmit the PDCP PDU.

When the reception terminal PDCP layer device re-arranges received pieces of data based on the PDCP sequence number or the COUNT value, or when the RLC layer device arranges a sequence of pieces of data received based on the RLC sequence number and transfers the same to the reception terminal PDCP layer device, the reception terminal PDCP layer device may identify whether or not a user data compression procedure (UDC) is applied for each data (e.g., PDCP PDU or PDCP SDU) by using an indicator of the UDC header, and may identify whether the context of the transmission UDC buffer is synchronized with the context of the current reception UDC buffer or both have the same context based on the checksum field value of the UDC header. When it is identified that the context of the transmission UDC buffer and the context of the current reception UDC buffer are not synchronized or the contexts are different when the checksum field value is calculated, a checksum failure or decompression error occurs, and the reception terminal PDCP layer device may transmit PDCP control data to the transmission terminal so as to indicate that the checksum failure or decompression error has occurred.

When the PDCP control data (feedback on checksum failure) is received, the transmission terminal PDCP layer device may initialize the transmission terminal UDC buffer and newly applies UDC compression to new data or data that has not been transmitted but has already been subjected to UDC compression. However, when the reception terminal PDCP layer device receives data, which has been previously processed and generated by the transmission terminal PDCP layer device before the PDCP control data is received, or data that has already been transferred to the lower layer device, the data may cause a checksum failure again or generate an error, or data that do not contain an indicator indicating that the transmission UDC buffer has been initialized will be discarded. Therefore, transmission resources may be wasted due to unnecessary data transmission in the above. Therefore, the disclosure proposes an efficient transmission terminal PDCP layer device operation or a reception terminal PDCP layer device operation for preventing unnecessary data transmission in response to a checksum failure that may occur in the user data compression or decompression procedure.

Specifically, when an uplink data compression procedure (UDC) is configured, the transmission PDCP layer device may apply an uplink data compression procedure to (1-1)th data (e.g., PDCP SDU), among pieces of the first data (e.g., PDCP SDU) received from an upper layer device, and may indicate that the UDC compression procedure has been applied thereto by using the indicator of the UDC header. Further, the transmission PDCP layer device may not apply the UDC procedure to (1-2)th data (e.g., PDCP SDU), and may indicate that the UDC compression procedure has not been applied by using the indicator of the UDC header.

In the above, the (1-1)th data may include general data received from an upper layer device (e.g., an application layer device). On the other hand, the (1-2) data may include data that has already been compressed once in an upper layer device (e.g., an application layer device). Since the data is data that has already been compressed once, the compression rate is not improved even if the UDC compression procedure is applied, and thus the UDC compression procedure may not be applied (whether or not to apply the UDC compression procedure to data may be configured through an RRC message).

In addition, the (1-2)th data may include SDAP control data (SDAP control PDU or end marker) received from an upper layer device (e.g., SDAP layer device), may not allow to apply the UDC compression procedure to the SDAP header or SDAP control to reduce the complexity of UE implementation, and may allow a DU of a base station, which is implemented by a central unit-distributed unit split (CU-DU) structure, to easily read information of SDAP header or SDAP control data.

In the above, with regard to pieces of data received from the upper layer device, the PDCP layer device of the transmission terminal may apply an uplink data compression procedure to (1-1)th data received from the upper layer device (e.g., PDCP SDU, upper layer device data, or application layer device data) and indicate that the UDC compression procedure has been applied thereto by using the UDC header indicator, thereby generating a PDCP header, and may process the same as (1-2)th data (e.g., PDCP data PDU or PDCP PDU). However, when the SDAP header is configured in the upper SDAP layer device of the PDCP layer device, the UDC compression method is not applied to the SDAP header attached to the data.

In addition, the PDCP layer device of the transmission terminal may not apply the UDC procedure to (2-1)th data received from the upper layer device (e.g., PDCP SDU, upper layer device data, or application layer device data) and indicate that the UDC compression procedure has not been applied thereto by using the UDC header indicator, thereby generating a PDCP header, and may process the same as (2-2)th data (e.g., PDCP data PDU or PDCP PDU).

In the above, the (2-1)th data may include data of an application layer device, data of an application layer to which a compression function is applied, SDAP control data (SDAP control PDU) of the SDAP layer device, or PDCP control data (PDCP control data) generated by the PDCP layer device. In addition, when the SDAP header of the SDAP layer device is configured, the UDC compression method is not applied to the SDAP header attached to the data.

In the above, a UE stores the data processed as described above (e.g., PDCP data PDU, PDCP PDU, or for example, (1-2)th data or (2-2)th data) for transmission when an uplink transmission resource is received, and if the PDCP layer device of the transmission terminal (e.g., the UE) receives PDCP control data (feedback indicating UDC checksum failure) indicating a checksum failure, UDC decompression failure, or error from the PDCP layer device of the reception terminal, in order to efficiently process the pieces of data which are pre-generated, stored, or preprocessed (e.g., PDCP data PDU, PDCP PDU, or (1-2)th data or (2-2)th data for example), the transmission PDCP layer device may perform one of the following methods or an application method based on the following methods.

First method: If the UDC compression or decompression procedure is configured in the PDCP layer device of the transmission terminal, and the PDCP layer device of the transmission terminal receives PDCP control data (PDCP control PDU) indicating the occurrence of checksum failure from the PDCP layer device of the reception terminal, the PDCP layer device of the transmission terminal may initialize the transmission UDC buffer for user data compression (UDC compression).

Alternatively, if the UDC compression or decompression procedure is configured in the PDCP layer device and the PDCP layer device of the transmission terminal receives PDCP control data (PDCP control PDU) indicating the occurrence of checksum failure from the PDCP layer device of the reception terminal, the transmission PDCP layer device may discard pieces of data for which a PDCP discard timer has not yet expired or which are pre-generated, stored, or pre-processed (e.g., PDCP PDU, PDCP data PDU, (1-2)th data, or (2-2)th data). Alternatively, if the pieces of data (e.g., PDCP PDU, PDCP data PDU, (1-2)th data, or (2-2)th data) are transferred to lower layer devices, the transmission PDCP layer device may transmit a data discard indicator regarding the pieces of data (e.g., PDCP PDU, PDCP data PDU, (1-2)th data, or (2-2)th data) to the lower layer device (e.g., the RLC layer device) so as to cause the pieces of data to be discarded.

Alternatively, in the above, when the transmission terminal PDCP layer device transmits the discard indicator to a lower layer device (e.g., an RLC layer device), a discard indicator only for PDCP user data (PDCP data PDU) may be transmitted and a discard indicator for PDCP control data may not be transmitted.

Alternatively, with regard to data (e.g., PDCP PDU, PDCP data PDU, (1-2)th data, or (2-2)th data) that has been discarded but not yet been transmitted in the above procedure, the transmission terminal PDCP layer device may apply the UDC compression method to the (1-1)th data based on the transmission UDC buffer initialized in an ascending order of PDCP SN or COUNT values, regenerate the (1-2)th data, and configure the PDCP sequence number (or new PDC sequence number), which is mapped to the (1-1)th data, in the PDCP header. Alternatively, the transmission terminal PDCP layer device may perform PDCP data processing for the (2-1)th data in an ascending order of the PDCP SN or COUNT values to regenerate the (2-2)th data, and may configure the PDCP sequence number (or new PDC sequence number), which is mapped to the (2-1)th data, in the PDCP header, so as not to generate a PDCP sequence number gap, or to minimize the same. In the above, the PDCP discard timer corresponding to the (1-1)th data or the (2-1)th data may be driven without being restarted or initialized.

Second method: If the UDC compression or decompression procedure is configured in the PDCP layer device of the transmission terminal, and the PDCP layer device of the transmission terminal receives PDCP control data (PDCP control PDU) indicating the occurrence of checksum failure from the PDCP layer device of the reception terminal, the PDCP layer device of the transmission terminal may initialize the transmission UDC buffer for user data compression (UDC compression).

Alternatively, if the UDC compression or decompression procedure is configured in the PDCP layer device and the PDCP layer device of the transmission terminal receives PDCP control data (PDCP control PDU) indicating the occurrence of checksum failure from the PDCP layer device of the reception terminal, the PDCP layer device of the transmission terminal may discard only pieces of the (1-2)th data (or PDCP data PDUs) to which the UDC compression procedure is applied, among pieces of data for which a PDCP discard timer has not yet expired or which are pre-generated, stored, or pre-processed. Alternatively, if the pieces of (1-2)th data (e.g., PDCP PDU or PDCP data PDUs) to which the UDC compression procedure is applied have been transferred to a lower layer device (e.g., RLC layer device), the PDCP layer device of the transmission terminal may transmit a data discard indicator regarding the pieces of (1-2)th data (e.g., PDCP PDU or PDCP data PDU) so as to cause the lower layer device to discard the pieces of (1-2)th data to which the UDC compression procedure is applied.

Alternatively, in the above, when the transmission terminal PDCP layer device transmits the discard indicator to a lower layer device (e.g., an RLC layer device), a discard indicator only for PDCP user data (PDCP data PDU) may be transmitted and a discard indicator for PDCP control data may not be transmitted.

Alternatively, with regard to data (e.g., PDCP PDU, PDCP data PDU, or (1-2)th data) that has been discarded but not yet been transmitted in the above procedure, the transmission terminal PDCP layer device may apply the UDC compression method to the (1-1)th data based on the transmission UDC buffer initialized in an ascending order of PDCP SN or COUNT values, regenerate the (1-2)th data, and configure the PDCP sequence number (or new PDC sequence number), which is mapped to the (1-1)th data, in the PDCP header, so as not to generate a PDCP sequence number gap, or to minimize the same. In the above, the PDCP discard timer corresponding to the (1-1)th data may be driven without being restarted or initialized.

The first method or the second method proposed in the disclosure may be applied to an LTE PDCP layer device or an NR PDCP layer device.

The lower layer device that has received the discard indicator according to the first method or the second method proposed in the disclosure may operate as follows.

As an RLC layer device, if an LTE RLC layer device has received an indicator indicating discarding data (e.g., PDCP user data) from the LTE or NR PDCP layer device in the above,
The LTE RLC layer device discards the user data if, with regard to user data (PDCP PDU, PDCP Data PDU, or RLC SDU) received from an upper layer device (PDCP layer device), a part of the user data has not yet mapped to the RLC user data (RLC data PDU) or has not been generated as RLC user data (When indicated from upper layer (i.e. PDCP) to discard a particular RLC SDU, the transmitting side of an AM RLC entity or the transmitting UM RLC entity shall discard the indicated RLC SDU if no segment of the RLC SDU has been mapped to a RLC data PDU yet). Accordingly, if a part of the user data has already mapped to RLC user data (RLC data PDU) or has been generated as RLC user data, the LTE RLC layer device may perform data transmission without discarding the user data.

As an RLC layer device, if an RLC layer device has received an indicator indicating discarding data (e.g., PDCP user data) from the LTE or NR PDCP layer device in the above,
The NR RLC layer device discards the user data if, with regard to user data (PDCP PDU, PDCP Data PDU, or RLC SDU) received from an upper layer device (PDCP layer device), the user data or part of the user data has never been transferred or transmitted to a lower layer device (When indicated from upper layer (i.e. PDCP) to discard a particular RLC SDU, the transmitting side of an AM RLC entity or the transmitting UM RLC entity shall discard the indicated RLC SDU, if neither the RLC SDU nor a segment thereof has been submitted to the lower layers). Accordingly, if the user data or a part of the user data has ever been transferred or transmitted to the lower layer device, the NR RLC layer device may perform data transmission without discarding the user data. Therefore, unlike the LTE RLC layer device, even if the user data is generated as RLC user data, if the NR RLC layer device does not transmit the user data to a lower layer device, the user data can be discarded, so that more data can be discarded and unnecessary data transmission can be more effectively prevented.

When the first method or the second method proposed in the disclosure is applied, a gap or difference in PDCP sequence numbers may occur, resulting in a transmission delay due to a reordering timer in the PDCP layer device of the reception terminal. In order to prevent transmission delay due to the reordering timer of the PDCP layer device as described above, one of the following methods or an applied method proposed by the disclosure may be applied.

Third method: In the third method, if the PDCP layer device of the reception terminal is an NR PDCP layer device, or if the PDCP layer device of the reception terminal has a checksum failure relating to the UDC compression method, or has transmitted PDCP control data (PDCP control PDU) due to the checksum failure, the PDCP layer device of the reception terminal may continuously store, in a buffer, pieces of data received thereafter, when receiving the PDCP sequence number of the data in which the checksum failure has occurred, the PDCP sequence number greater than the COUNT value, or data corresponding to the COUNT value, until data indicating that an FR bit is configured to be 1 as a result of identification of the FR bit of the UDC header and thus indicating that the transmission UDC buffer is initialized is received. In the above, when receiving data corresponding to the PDCP sequence number of the data in which the checksum failure has occurred, or the PDCP sequence number smaller than the COUNT value, or data corresponding to the COUNT value, the PDCP layer device of the reception terminal may identify the indicator of the UDC header and discard the data to which the UDC compression method is applied because UDC decompression for the data may occur.

As another method, by identifying the UDC header for the stored pieces of data, pieces of data to which the UDC compression method is not applied may be processed first and transferred to an upper layer. If the FR bit of the UDC header of the received data is configured to be 1 to indicate data indicating that the transmission UDC buffer is initialized, the reordering timer may be stopped and initialized if the reordering timer is running. Alternatively, from among the stored data, with regard to pieces of data having the PDCP sequence number or COUNT value equal to or greater than the PDCP sequence number or COUNT value of the data in which the FR bit of the UDC header is configured to be 1, the pieces of data may be sequentially processed continuously without a gap in the PDCP sequence number or COUNT value (e.g., applying or not applying a UDC decompression method based on an indicator of a UDC header) and transferred to an upper layer device.

In the above, with regard to pieces of data having the PDCP sequence number or COUNT value equal to or greater than the PDCP sequence number or COUNT value of the data in which the FR bit of the UDC header is configured to be 1, if a gap in the PDCP sequence number or COUNT value is identified when the pieces of data are sequentially processed continuously without a gap in the PDCP sequence number or COUNT value, the data is processed as above, and the variable for reordering may be updated with the current reordering variable value or the PDCP sequence number or COUNT value of the first data which is not transmitted to the upper layer device and having the PDCP sequence number or COUNT value greater than that of the data in which the FR bit of the UDC header is configured to be 1. In addition, if a gap between the PDCP sequence number or COUNT value is identified, for example, if the PDCP sequence number or COUNT value expected to be received next is greater than the reordering variable value, the reordering timer may be started or restarted.

Fourth method: In the fourth method, if the PDCP layer device of the reception terminal is an LTE PDCP layer device, or if the PDCP layer device of the reception terminal has a checksum failure relating to the UDC compression method, or has transmitted PDCP control data (PDCP control PDU) due to the checksum failure, the PDCP layer device of the reception terminal may discard pieces of data received thereafter, when receiving the PDCP sequence number of the data in which the checksum failure has occurred, the PDCP sequence number greater than the COUNT value, or data corresponding to the COUNT value, until data indicating that an FR bit is configured to be 1 as a result of identification of the FR bit of the UDC header and thus indicating that the transmission UDC buffer is initialized is received. This is because the LTE RLC layer device arranges the pieces of data in order and transmits the data.

As another method, by identifying the UDC header for the stored pieces of data, pieces of data to which the UDC compression method is not applied may be processed first and transferred to an upper layer. If the FR bit of the UDC header of the received data is configured to be 1 to indicate data indicating that the transmission UDC buffer is initialized, the reordering timer may be stopped and initialized if the reordering timer is running. Alternatively, from among the pieces of data received thereafter or the stored data, with regard to pieces of data having the PDCP sequence number or COUNT value equal to or greater than the PDCP sequence number or COUNT value of the data in which the FR bit of the UDC header is configured to be 1, the pieces of data may be sequentially processed continuously without a gap in the PDCP sequence number or COUNT value (e.g., applying or not applying a UDC decompression method based on an indicator of a UDC header) and transferred to an upper layer device.

In the above, with regard to pieces of data having the PDCP sequence number or COUNT value equal to or greater than the PDCP sequence number or COUNT value of the data in which the FR bit of the UDC header is configured to be 1, if a gap in the PDCP sequence number or COUNT value is identified when the pieces of data are sequentially processed continuously without a gap in the PDCP sequence number or COUNT value, the data is processed as above, and the variable for reordering may be updated with the current reordering variable value, or the PDCP sequence number or COUNT value of the first data which is not transmitted to the upper layer device or that of the last data which is transmitted to the upper layer and having the PDCP sequence number or COUNT value greater than that of the data in which the FR bit of the UDC header is configured to be 1. In addition, if a gap between the PDCP sequence number or COUNT value is identified, for example, if the PDCP sequence number or COUNT value expected to be received next is greater than the reordering variable value, the reordering timer may be started or restarted.

In addition, in the above of the disclosure, even if the UDC compression method for performing compression on the entire data (e.g., PDCP SDU) received from the upper layer device as described above is proposed, when the upper layer device is an Ethernet protocol or the upper layer device is an SDAP layer device and the upper layer device of the SDAP layer device is the Ethernet protocol, proposed is also a method of applying a Ethernet header compression method (EHC) to only the header part of the upper layer device corresponding to the Ethernet header with regard to the data (e.g., PDCP SDU) received by the PDCP layer device from the upper layer device.

In addition, in the above of the disclosure, even if the UDC compression method for performing compression on the entire data (e.g., PDCP SDU) received from the upper layer device as described above is proposed, when the upper layer device is a TCP or IP protocol or the upper layer device is an SDAP layer device and the upper layer device of the SDAP layer device is the TCP or IP protocol, proposed is also a method of applying an ROHC header compression method to only the header part of the upper layer device corresponding to the TCP or IP header with regard to the data (e.g., PDCP SDU) received by the PDCP layer device from the upper layer device.

In addition, in the disclosure, when the base station configures the Ethernet header compression method (or ROHC header compression method) and the UDC compression method at the same time through the RRC message, the compression rate is not greatly improved and only the data processing burden and complexity increase, and thus the UDC compression method and the Ethernet header compression method (or the ROHC header compression method) are required not to be configured at the same time. That is, the Ethernet header compression method (or the ROHC header compression method) may be configured for each uplink or downlink of the PDCP layer device, and may be configured when the UDC compression method is not configured. In addition, the UDC compression method may be configured for each uplink or downlink of the PDCP layer device, and may be configured when the Ethernet header compression method (or the ROHC header compression method) is not configured. However, in the above, the Ethernet header compression method and the ROHC header compression method can be configured simultaneously through the RRC message, so as to allow the header compression procedure to be independently performed for the Ethernet header or the TCP/IP header to greatly improve the compression rate.

In addition, since the Ethernet header compression method through the RRC message is a feedback-based method, the Ethernet header compression method cannot be applied via a one directional or unidirectional link (e.g., a bearer to which an RLC UM layer device is applied and data transmission is possible in only one direction), and thus the Ethernet header compression method cannot be configured through the RRC message with regard to the one directional or unidirectional link, and can be configured only via a bi-directional link.

In addition, when the UDC compression method is configured via the downlink or the uplink through the RRC message, it is possible to limit that the out-of-sequence delivery function cannot be configured in the LTE RLC layer device connected to the LTE or NR PDCP layer device in which the UDC compression method is configured. In addition, the UDC compression method or the UDC decompression method proposed by the disclosure may be extended to the RLC UM mode and thus may be configured for the uplink or downlink.

In the above, initializing the UDC buffer may indicate initializing all values of the UDC buffer to 0. As another method, when a predefined dictionary is preconfigured through an RRC message, initializing the UDC buffer may indicate inputting and initializing the predefined dictionary to values of the UDC buffer. A UDC compression procedure is newly applied using the initialized transmission UDC buffer, a UDC header is generated and configured, and then data transmission may be performed by applying an encoding or integrity protection procedure.

In the above, the UDC header of the first data (PDCP PDU), for which data processing is performed by initializing the transmission UDC buffer and applying the UDC compression procedure for the first time, may indicate that the transmission UDC buffer of the transmission PDCP layer device is initialized using a 1-bit indicator, or may indicate to initialize the reception UDC buffer of the reception PDCP layer device. Since the reception PDCP layer device does not know data on which the transmission UDC buffer is initialized and UDC compression is newly performed, the transmission PDCP layer device provides an instruction using the 1-bit indicator of the UDC buffer, and the reception PDCP layer device may identify the 1-bit indicator and initialize the reception UDC buffer, and may perform the UDC decompression procedure for the data first by using the initialized received UDC buffer.

Therefore, if the 1-bit indicator in the UDC header of the received data (e.g., PDCP PDU) indicates to initialize the reception UDC buffer, the reception PDCP layer device may know that the transmission UDC buffer has already been initialized and that UDC compression is newly applied to the data. Accordingly, the reception PDCP layer device may initialize the reception UDC buffer and apply the UDC decompression procedure for the data first using the initialized reception UDC buffer.

In the disclosure, the PDCP SDU may indicate raw data received by the transmission PDCP layer device from the upper layer device, and the PDCP PDU may indicate data which is subject to all data processing in the transmission PDCP layer device and then to be transmitted to the lower layer device. In the above, the data processing may include processing, such as integrity protection and verification, header compression, user layer data compression, or encoding procedure, which are configured in the PDCP layer device. In addition, a PDCP PDU, which is generated by performing data processing of the PDCP SDU, is separate data different from the PDCP SDU, the PDCP SDU is stored even when the PDCP PDU is discarded, and the PDCP SDU is discarded only by the PDCP data discard timer.

Figure 5:
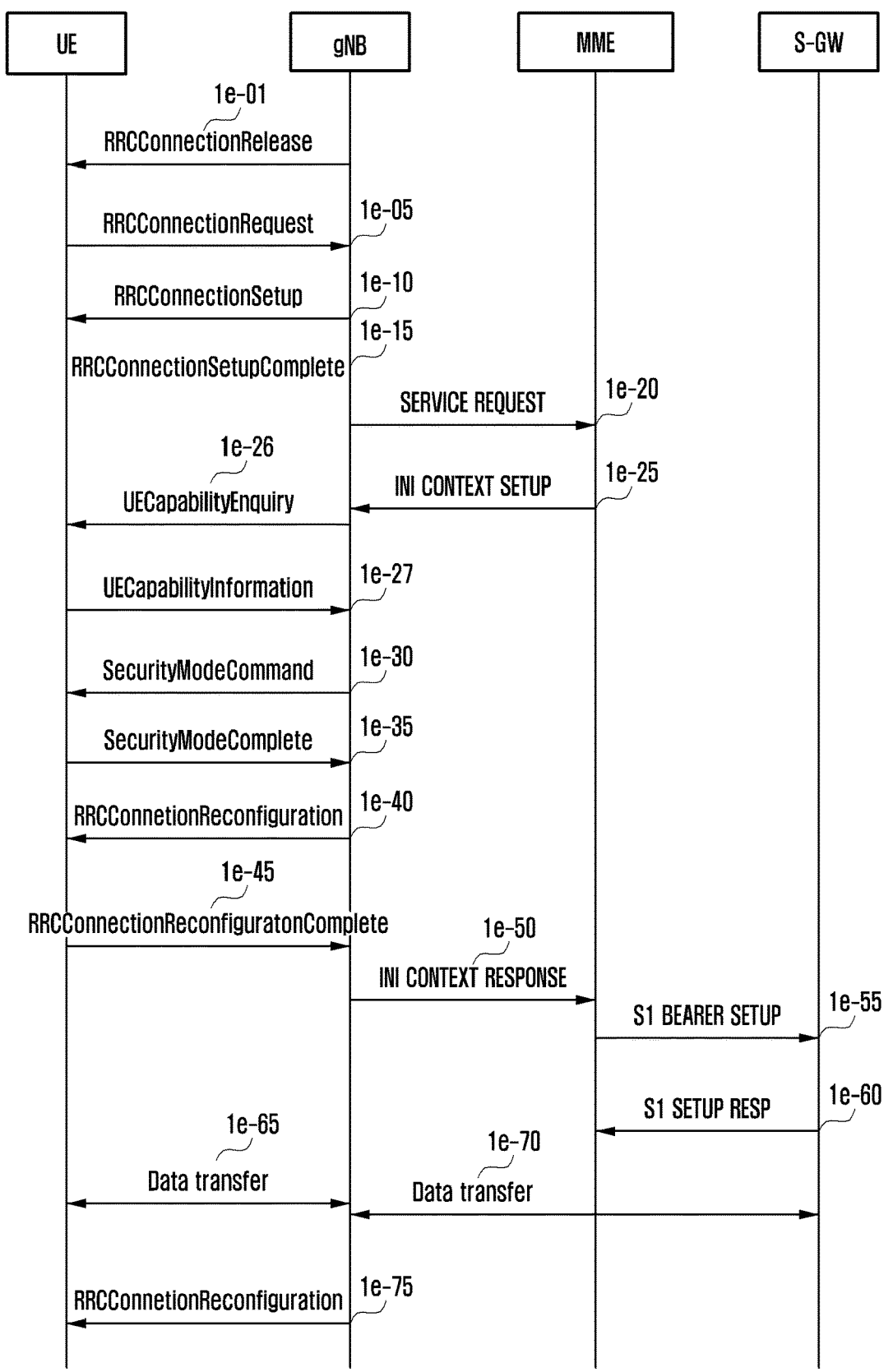
FIG. 5 illustrates a procedure of configuring whether a base station is to perform uplink data compression when the UE establishes a connection with a network, proposed by the disclosure.

FIG. 5 illustrates a procedure of configuring whether a base station is to perform uplink data compression when a UE establishes a connection with a network, proposed by the disclosure.

FIG. 5 illustrates a procedure in which a UE switches from an RRC idle mode or an RRC inactive mode (or lightly-connected mode) to an RRC connected mode and establishes a connection with a network, and illustrates a procedure of configuring whether to perform uplink data compression (UDC).

Referring to FIG. 5, when a UE for performing data transmission or reception in the RRC connected mode does not perform data transmission or reception for a predetermined reason or for a predetermined time, a base station may transmit an RRCConnectionRelease message to the UE to allow the UE to be switched to the RRC idle mode (indicated by reference numeral 1e-01). Subsequently, a UE (hereinafter, idle mode UE), to which a connection is not currently established, may perform an RRC connection establishment process with the base station when data to be transmitted is generated. The UE establishes reverse transmission synchronization with the base station through a random access process and transmits an RRCConnectionRequest message to the base station (indicated by reference numeral 1e-05). The message may include a cause (establishmentCause) for establishing a connection with an identifier of the UE. The base station transmits an RRCConnectionSetup message so that the UE establishes an RRC connection (indicated by reference numeral 1e-10).

The message may include information indicating whether to use or not to use a data compression method via uplink (UDC) or whether to use or not to use a data compression method via downlink for each logical channel (logicalchannelconfig), for each bearer, or for each PDCP device (PDCP-config). Further, more specifically, the RRCConnectionSetup message may indicate whether to use uplink data compression method (UDC) in each logical channel, bearer, or each PDCP device (or SDAP device), only with regard to a certain IP flow or a certain QoS flow (The base station may configure, for the SDAP device, information about IP flow or QoS flow relating to whether to use or not to use the uplink data compression method, so that the SDAP device may indicate, to the PDCP device, each QoS flow relating to whether to use or not to use the uplink data compression method, or the PDCP device may identify each QoS flow for itself and determine whether to apply or not to apply the uplink data compression method). In addition, if instructed to use the uplink data compression method, a predefined library to be used in the uplink data compression method, an identifier for dictionary information (Dictionary), or a buffer size to be used in the uplink data compression method may be indicated through the message.

In addition, the message may include a command which sets up or releases performing uplink decompression. In addition, the uplink data compression method in the above may always be configured with an RLC AM bearer (an ARQ function, a lossless mode having a retransmission function), and may not be configured together with a header compression protocol (ROHC). In addition, the RRCConnectionSetup message includes RRC connection configuration information and the like. In addition, the RRCConnectionSetup message may include RRC connection configuration information. The RRC connection is also referred to as a signaling radio bearer (SRB) and is used for transmitting or receiving an RRC message, which is a control message between a UE and a base station.

A UE, which has established an RRC connection, may transmit an RRCConnetionSetupComplete message to the base station (indicated by reference numeral 1e-15). If the base station does not know a UE capability of a UE that is currently establishing a connection or if the base station desires to identify a UE capability, the base station may transmit a message asking about the UE capability. Further, the UE may transmit a message reporting its own capability. The message reporting its own capability may indicate whether the UE is capable of using the uplink data compression (UDC) or capable of using the downlink data compression method, and may include an indicator indicating the same. The RRCConnetionSetupComplete message may include a control message, which is referred to as SERVICE REQUEST, requesting a bearer setup for a predetermined service from an MME by the UE.

The base station transmits the SERVICE REQURST message stored in the RRCConnetionSetupComplete message to the MME (indicated by reference numeral 1e-20), and the MME determines whether to provide a service requested by the UE. As a result of the determination, when the UE determines to provide the requested service, the MME transmits an INITIAL CONTEXT SETUP REQUEST message to the base station (indicated by reference numeral 1e-25). The INITIAL CONTEXT SETUP REQUEST message may include information, such as quality of service (QoS) information to be applied in a case where a data radio bearer (DRB) is configured and security-related information (for example, a security key and a security algorithm) to be applied to the DRB. The base station may exchange a SecurityModeCommand message 1e-30 and a SecurityModeComplete message 1e-35 in order to establish security with the UE.

When the security configuration is completed, the base station transmits an RRCConnectionReconfiguration message to the UE (indicated by reference numeral 1e-40). The RRCConnectionReconfiguration message may include information indicating whether to use or not to use a data compression method via uplink (UDC) or whether to use or not to use a data compression method via downlink for each logical channel (logicalchannelconfig), for each bearer, or for each PDCP device (PDCP-config). Further, more specifically, the RRCConnectionReconfiguration message may indicate whether to use uplink data compression method (UDC) in each logical channel, bearer, or each PDCP device (or SDAP device), only with regard to a certain IP flow or a certain QoS flow (The base station may configure, for the SDAP device, information about IP flow or QoS flow relating to whether to use or not to use the uplink data compression method, so that the SDAP device may indicate, to the PDCP device, each QoS flow relating to whether to use or not to use the uplink data compression method, or the PDCP device may identify each QoS flow for itself and determine whether to apply or not to apply the uplink data compression method).

In addition, when use of an uplink data compression method is indicated, the message may indicate a predefined library to be used in the uplink data compression method, an identifier for dictionary information (Dictionary), or a buffer size to be used in the uplink data compression method. In addition, the message may include a command which sets up or releases performing of uplink decompression. In addition, the uplink data compression method in the above may always be configured with an RLC AM bearer (an ARQ function, a lossless mode having a retransmission function), and may not be configured together with a header compression protocol (ROHC).

In addition, the message includes configuration information of a DRB through which user data is processed, and the UE configures the DRB by applying the information and transmits an RRCConnectionReconfigurationComplete message to the base station (indicated by reference numeral 1e-45). The base station, which has completed the DRB setup with the UE, transmits an INITIAL CONTEXT SETUP COMPLETE message to the MME (indicated by reference numeral 1e-50), and the MME, which has received the INITIAL CONTEXT SETUP COMPLETE message, exchanges an S1 BEARER SETUP message and an S1 BEARER SETUP RESPONSE message in order to configure S1 bearer with an S-GW (indicated by reference numerals 1e-055 and 1e-60). The S1 bearer is a connection for data transmission, established between the S-GW and the base station, and corresponds to the DRB in one-to-one relationship.

When all of the above processes are completed, the UE transmits or receives data to or from the base station through the S-GW (indicated by reference numerals 1e-65 and 1e-70). This general data transmission process is largely configured by three stages of RRC connection configuration, security configuration, and DRB configuration. In addition, the base station may transmit an RRCConnectionReconfiguration message in order to newly perform, add, or change the configuration for the UE for a predetermined reason (indicated by reference numeral 1e-75).

The message may include information indicating whether to use or not to use a data compression method via uplink (UDC) or whether to use or not to use a data compression method via downlink for each logical channel (logicalchannelconfig), for each bearer, or for each PDCP device (PDCPconfig). Further, more specifically, the RRCConnectionSetup message may indicate whether to use uplink data compression method (UDC) in each logical channel, bearer, or each PDCP device (or SDAP device), only with regard to a certain IP flow or a certain QoS flow (The base station may configure, for the SDAP device, information about IP flow or QoS flow relating to whether to use or not to use the uplink data compression method, so that the SDAP device may indicate, to the PDCP device, each QoS flow relating to whether to use or not to use the uplink data compression method, or the PDCP device may identify each QoS flow for itself and determine whether to apply or not to apply the uplink data compression method).

In addition, if instructed to use the uplink data compression method, a predefined library to be used in the uplink data compression method, or an identifier for dictionary information (Dictionary), or a buffer size to be used in the uplink data compression method may be indicated through the message. In addition, the RRCConnectionSetup message may include a command for setup or releasing so as to perform uplink decompression. In addition, the uplink data compression method in the above may always be configured with an RLC AM bearer (an ARQ function, a lossless mode having a retransmission function), and may not be configured together with a header compression protocol (ROHC).

In addition, when the Ethernet header compression method (or ROHC header compression method) and uplink data compression (UDC) method are simultaneously configured through an RRC message (for example, an RRCSetup message, RRCResume message, or RRCReconfiguration message), data processing burden and complexity can be increased while the data compression rate is not significantly improved. Therefore, in the disclosure, the UDC compression method and the Ethernet header compression method (or the ROHC header compression method) may be limited not to be configured at the same time. That is, the Ethernet header compression method (or the ROHC header compression method) may be configured for each uplink or downlink of the PDCP layer device, and may be configured when the UDC compression method is not configured.

In addition, the UDC compression method may also be configured for each uplink or downlink of the PDCP layer device, and may be configured when the Ethernet header compression method (or the ROHC header compression method) is not configured. However, in the above description, the Ethernet header compression method and the ROHC header compression method can be configured at the same time through the RRC message, so as to allow the header compression procedure to be independently performed for the Ethernet header or TCP/IP header to greatly improve the compression rate.

In addition, since the Ethernet header compression method through the RRC message is a feedback-based method, the Ethernet header compression method cannot be applied via a one directional or unidirectional link (e.g., a bearer to which an RLC UM layer device is applied and data transmission is possible in only one direction), and thus the Ethernet header compression method cannot be configured through the RRC message with regard to the one directional or unidirectional link, and can be configured only via a bi-directional link.

In addition, when the UDC compression method is configured via the downlink or the uplink through the RRC message, it is possible to limit that the out-of-sequence delivery function cannot be configured in the LTE RLC layer device connected to the LTE or NR PDCP layer device in which the UDC compression method is configured. In addition, the UDC compression method or the UDC decompression method proposed by the disclosure may be extended to the RLC UM mode and thus may be configured for the uplink or downlink.

Figure 6:
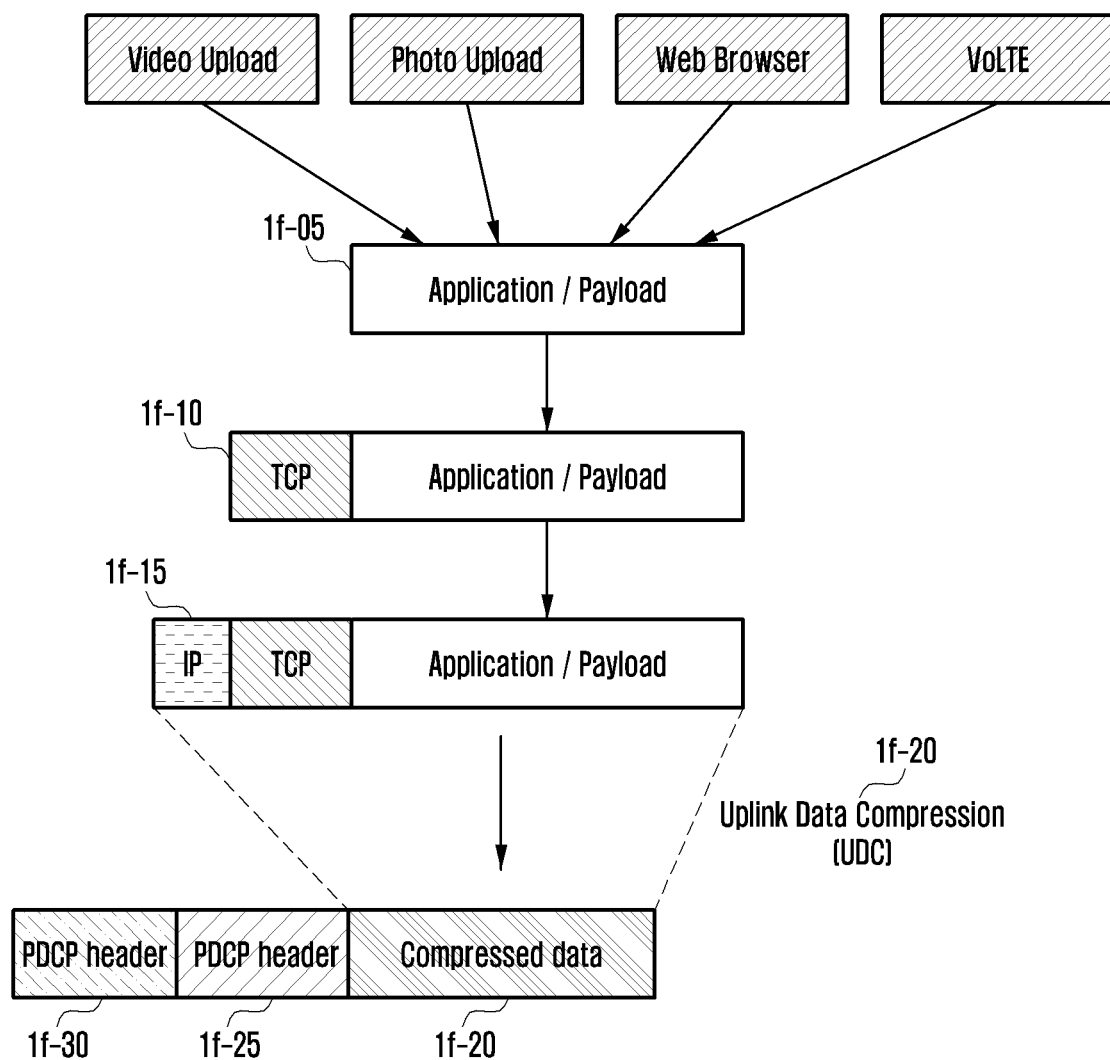
FIG. 6 illustrates a data configuration and a procedure of performing uplink data compression, proposed by the disclosure.

FIG. 6 illustrates a data configuration and a procedure of performing uplink or downlink data compression, proposed by the disclosure.

In FIG. 6, uplink data 1f-05 may be generated as data corresponding to services, such as video transmission, photo transmission, web search, and VoLTE. Pieces of data generated by an application layer device may be processed through a UDP or TCP/IP corresponding to a network data transport layer, configure respective headers 1f-10 and 1f-15 and may be transferred to the PDCP layer. When the PDCP layer receives data (PDCP SDU) from an upper layer, the PDCP layer may perform the following procedure.

If an uplink data compression method is configured to be used in the PDCP layer through RRC messages such as 1e-10, 1e-40, or 1e-75 in FIG. 5, the uplink data compression method is performed with regard to the PDCP SDU, as shown in reference numeral 1f-20 of FIG. 6, so as to compress uplink data, a corresponding UDC header (header for compressed uplink data) 1f-25 is configured, and ciphering on compressed data except for the UDC header is performed. If integrity protection is configured, integrity protection is performed, and a PDCP PDU may be configured by configuring the PDCP header 1f-30. In the above, the PDCP layer device includes a UDC compression/decompression device, determines whether or not to perform the UDC procedure for each piece of data as configured in the RRC message, and uses the UDC compression/decompression device. A transmission terminal performs data compression using the UDC compression device in a transmission PDCP layer device, and the reception terminal performs data decompression using the UDC decompression device in a reception PDCP layer device.

The procedure of FIG. 6 described above can be applied not only to when the UE performs uplink data compression but also to downlink data compression. In addition, the description with regard to the uplink data may be applied to the downlink data in the same manner.

Figure 7:
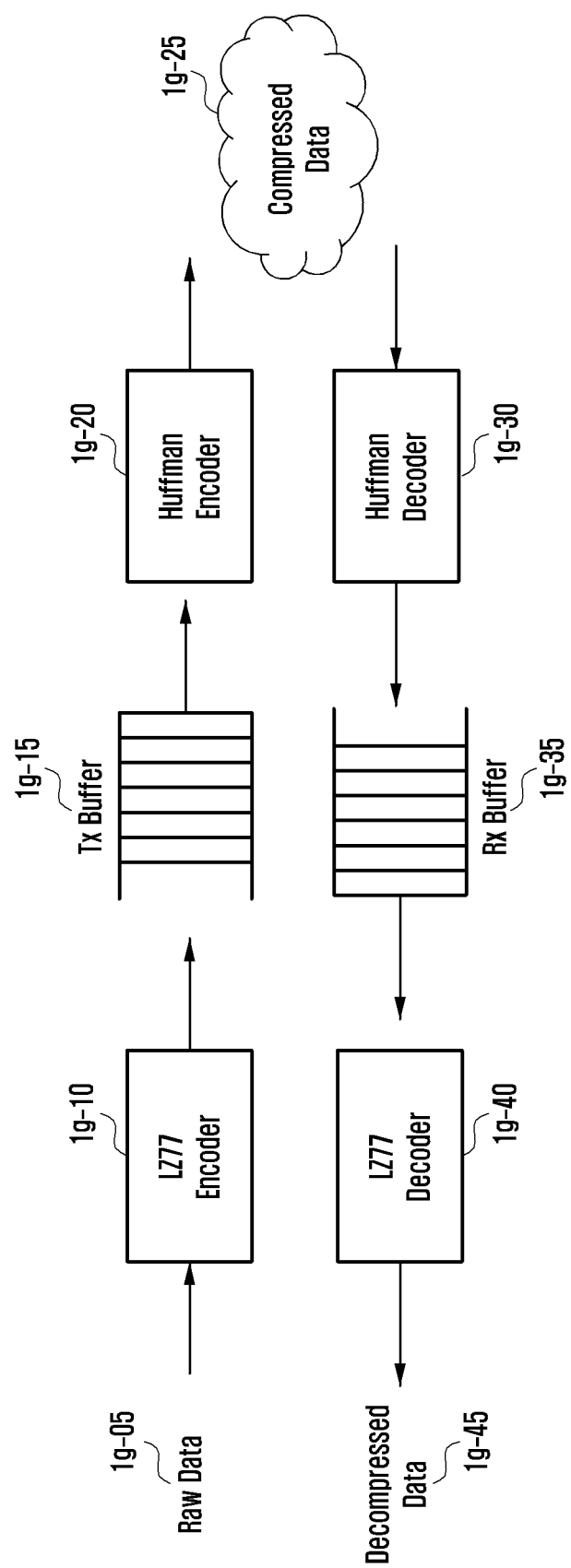
FIG. 7 illustrates an embodiment of an uplink data compression method, which may be applied according to the disclosure.

FIG. 7 illustrates an embodiment of an uplink data compression method, which may be applied according to the disclosure.

FIG. 7 is a view illustrating a description of a DEFLATE-based uplink data compression algorithm, and the DEFLATE-based uplink data compression algorithm is a lossless compression algorithm. The DEFLATE-based uplink data compression algorithm basically compresses uplink data by combining the LZ77 algorithm and Huffman coding. The LZ77 algorithm performs an operation of searching for a duplicate array of data. When searching for duplicate arrays, if duplicate arrays are found by searching for duplicate arrays through a sliding-window, the LZ77 algorithm expresses the position and degree of overlapping of the duplicate arrays in the sliding window as lengths to perform data compression. The sliding window is also called a buffer in the uplink data compression (UDC) method, and may be configured as 8 kilobytes or 32 kilobytes. That is, the sliding window or buffer may perform compression by recording 8192 or 32768 characters, searching for duplicate arrays, and expressing them by position and length.

Therefore, since the LZ algorithm is a sliding-window method, that is, since previously coded data is updated in a buffer, and coding is again performed on subsequent data, there is a correlation between successive data. Therefore, the coded data should be decoded normally, after which the data can be decoded normally. The compressed codes (expression of position, length, etc.), expressed by position and length according to the LZ77 algorithm, are compressed once more via Huffman coding.

The Hoffman coding searches for duplicate codes again, and uses a short notation for codes with a high degree of overlapping and a long notation for codes with a low degree of overlapping so as to perform compression once again. The Hoffman coding is prefix coding, and is an optimal coding scheme in which all codes are uniquely decodable.

As described above, the transmission terminal performs encoding by applying the LZ77 algorithm to the raw data 1g-05 (indicated by reference numeral 1g-10), updates the buffer (indicated by reference numeral 1g-15), produces checksum bits for the contents (or data) of the buffer, and configures the same in the UDC header. The checksum bits are used at the reception terminal in order to determine whether the buffer status is valid. Codes encoded with the LZ77 algorithm may be compressed once again with Huffman coding and transmitted as uplink data (indicated by reference numeral 1g-25).

The reception terminal performs a decompression procedure on the received compressed data, contrary to the transmission terminal. That is, the reception terminal performs Hoffman decoding (indicated by reference numeral 1g-30), updates the buffer (indicated by reference numeral 1g-35), and identifies the validity of the updated buffer through the checksum bits of the UDC header. When it is determined that there are no errors in the checksum bits, the reception terminal may perform decoding through the LZ77 algorithm (indicated by reference numeral 1g-40) to decompress data and reconstruct the raw data, and transfer the reconstructed data to an upper layer (indicated by reference numeral 1g-45).

As described above, since the LZ algorithm is a sliding-window method, that is, previously coded pieces of data are updated in a buffer, and immediately subsequent pieces of data are coded again, consecutive pieces of data are correlated. Therefore, only if previously coded pieces of data are decoded normally, it is possible to normally decode subsequent pieces of data. Therefore, a reception PDCP layer device identifies a PDCP sequence number of a PDCP header and identifies a UDC header (identifies an indicator indicating whether data compression has been performed or not) to perform a data compression procedure on pieces of data to which a data compression procedure has been applied, according to an ascending order of PDCP sequence number.

A procedure in which a base station performs uplink data compression (UDC) configuration to a UE, and a procedure in a UE performs uplink data compression (UDC), proposed in the disclosure are given as follows.

A base station may configure or release, for a UE, performing of uplink data compression on a bearer or a logical channel in which an RLC AM mode is configured, through RRC messages such as 1e-10, 1e-40, or 1e-75 in FIG. 5. In addition, the base station may reset a UDC device (or protocol) of a PDCP layer device of the UE by using the RRC message. The resetting of the UDC device (or protocol) implies resetting of a UDC buffer for uplink data compression of the UE, and is performed to synchronize a UDC buffer of the UE with a UDC buffer for uplink data decompression of the base station. The resetting of a buffer of the UDC device may define a new PDCP control PDU so that a transmission terminal (base station) resets a UDC buffer of a reception terminal (UE) and performs synchronization for user data compression/decompression between the transmission terminal and the reception terminal, by using the PDCP control PDU instead of the RRC message. In addition, the base station may configure whether to perform uplink data compression, for each bearer, each logical channel, or each PDCP layer device by using the RRC message. More specifically, the base station may configure whether to perform or not to perform uplink data decompression, for each IP flow (or QoS flow) in one bearer, logical channel, or PDCP layer device.

In addition, the base station may configure a PDCP discard timer value for the UE by the RRC message. As the PDCP discard timer value, a PDCP discard timer value for data for which uplink data compression is not performed, and a PDCP discard timer value for data to which uplink data compression is applied may be configured separately.

If the UE is configured to perform uplink data compression on a predetermined bearer, logical channel, or PDCP layer device (or some QoS flows of a predetermined bearer, logical channel, or PDCP layer device) by the RRC message, the UE resets a buffer in a UDC device of a PDCP layer device according to the configuration, and prepares an uplink data compression process. In addition, when the UE receives data (i.e., PDCP SDU) from an upper layer and is configured to perform uplink data compression on the PDCP layer device, the UE performs uplink data compression on the received data. If the UE is configured to perform uplink data compression on only particular QoS flows of the PDCP layer device, the UE identifies a QoS flow identifier or an indication of an upper SDAP layer to determine whether to perform uplink data compression and then performs uplink data compression. If the UE performs uplink data compression (UDC) and updates a buffer according to the data compression, the UE configures a UDC buffer.

In the above description, if the UE performs uplink data compression (UDC), the UE may compress a PDCP SDU received from an upper layer to be UDC compression data (UDC block) having a smaller size. The UE configures a UDC header relating to compressed UDC compression data. The UDC header may include an indicator indicating whether uplink data compression has been performed or not (e.g., if a 1-bit indicator of the UDC header is 0, this implies UDC has been applied, and if the indicator is 1, this implies UDC has been unapplied). In the above description, a case where the UE does not apply uplink data compression may include a case where data compression is unable to be performed by the above described UDC compression method (DEFLATE algorithm) since a PDCP SDU data structure received from an upper layer is not a repetitive data structure. In the above description, if the UE performs uplink data compression (UDC) on data (PDCP SDU) received from an upper layer and updates a UDC buffer, the UE may calculate checksum bits and include same in the UDC buffer in order to allow a reception terminal PDCP layer device to identify the validity of the updated UDC buffer (the checksum bits have a predetermined length, and may be configured by 4 bits, for example).

In the above, a transmission PDCP layer device may initialize a transmission UDC buffer; and define and configure one bit in a UDC header 1e-02 of first data to which UDC compression is newly applied after the initialization of the transmission UDC buffer, to instruct a reception PDCP layer device to initialize a reception UDC buffer and newly start UDC decompression on the data for which the UDC header 1i-02 is configured, by using the initialized reception UDC buffer. For example, a transmission PDCP layer device may define a FR field as indicated by reference numeral 1i-05 in FIG. 9, and give an indication through the FR field. In addition, whether a transmission PDCP layer device in which a UDC compression process is configured as described above has applied the UDC compression process to data received from an upper layer may be defined by one bit, for example, an FU field 1i-10, and may be indicated through the FU field.

The UE performs ciphering of data to which uplink data decompression has been applied or not as described above, performs integrity protection if the integrity protection is configured, and then transfers the data to a lower layer.

Figure 8:
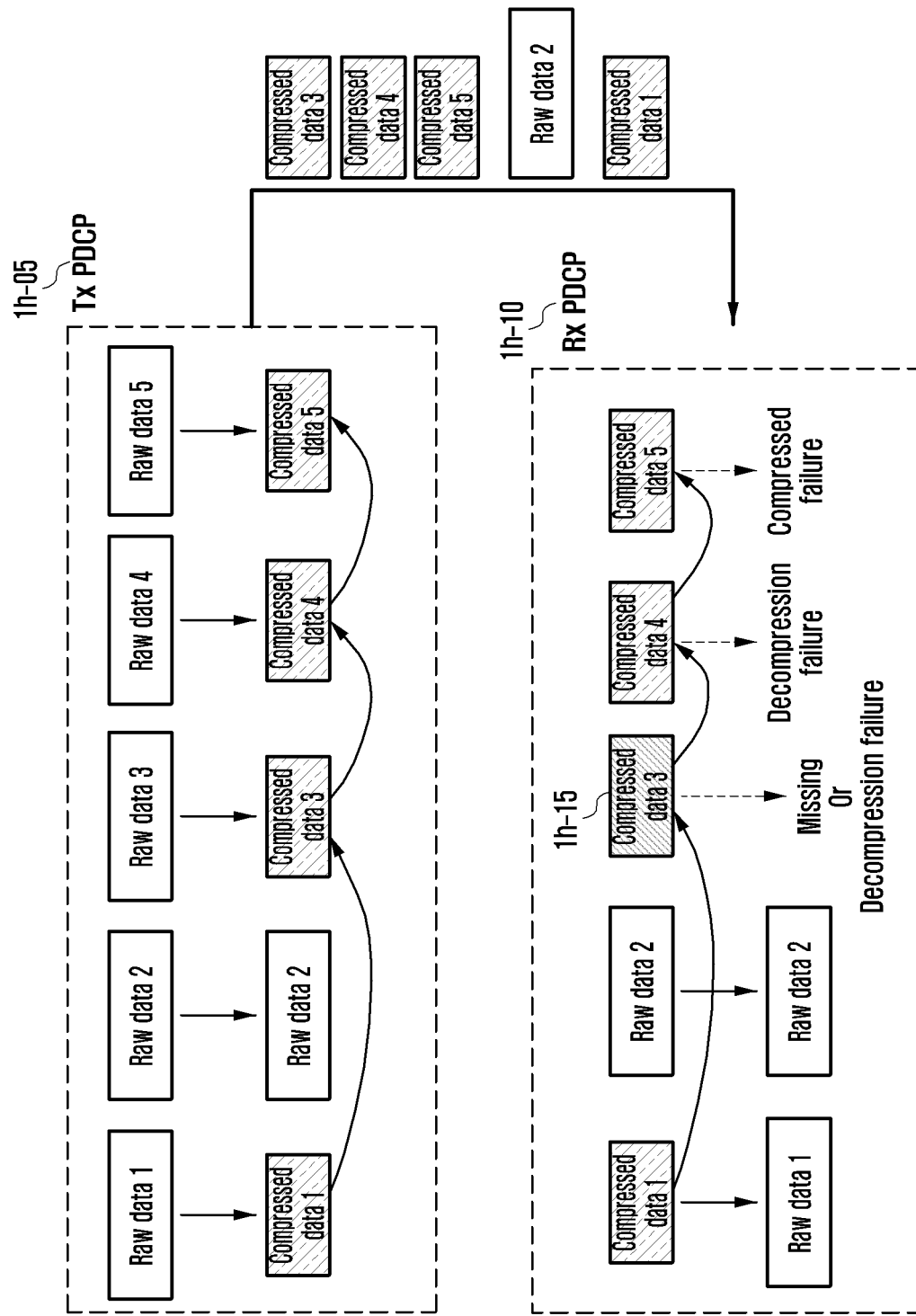
FIG. 8 illustrates a problem in which decompression failure occurs in an uplink data compression method described according to the disclosure.

FIG. 8 illustrates a problem in which a decompression failure occurs in an uplink or downlink data compression method described according to the disclosure.

As described above with reference with FIG. 7, an algorithm (DEFLATE algorithm (performing of Huffman coding after LZ77 algorithm is performed) performing uplink data compression (UDC) is a scheme in which when a transmission terminal performs data compression, the transmission terminal updates previously compressed data in a buffer, compares the data with data to be compressed next, based on the buffer, searches for a repetitive structure, and compresses the structure by position and length. Therefore, only if a reception terminal performs decompression in a sequence in which the transmission has performed compression, the decompression may succeed.

For example, in a case where the transmission terminal performs UDC compression on pieces of data having PDCP sequence numbers 1, 3, 4, and 5, and does not perform UDC compression on data having PDCP sequence number 2 (as indicated by reference numeral 1h-05), the reception terminal is also required to perform decompression on received data in a PDCP layer device in a sequence of PDCP sequence numbers 1, 3, 4, and 5, to successfully perform the decompression.

When the transmission terminal performs UDC compression as described above, this performing is indicated by a UDC header, and thus the reception terminal may also determine whether UDC compression is applied, by identifying the UDC header. If data 1h-15 corresponding to PDCP sequence number 3 is lost in a procedure of performing a series of UDC decompression as described above, UDC decompression of data after the data is failed all. That is, UDC decompression is unable to be performed on pieces of data having PDCP sequence numbers 4 and 5 (as indicated by reference numeral 1h-10). Therefore, there should be no lost data (packet) in an uplink decompression process, and the reception terminal is required to perform decompression in a sequence in which the transmission terminal has performed UDC compression on data. Therefore, an RLC AM mode in which there is no loss and there is a retransmission function is required to be operated.

However, loss data described above may be incurred by a PDCP discard timer of the PDCP layer device. That is, the PDCP layer device drives a timer with a PDCP discard timer value configured by the RRC message for each data (packet or PDCP SDU) received from an upper layer. If the timer is expired, the PDCP layer device discards data corresponding to the timer. Therefore, if a timer of data for which UDC compression has been performed is expired, the data may be discarded, and thus the reception terminal may fail to perform UDC decompression on pieces of UDC-compressed data thereafter.

As described with reference to FIG. 7 of the disclosure, according to an algorithm (DEFLATE algorithm (performing of Huffman coding after LZ77 algorithm is performed)) performing uplink data compression (UDC), when a transmission terminal performs uplink data compression, uplink data compression is performed, and then the transmission terminal generates checksum by using current buffer contents and configures the checksum in a UDC buffer. The transmission terminal updates the buffer by using raw data of compressed data, compares the raw data with data to be compressed next, based on the buffer, searches for a repetitive structure, and compresses the structure by the position and length. In the above, checksum bits in a UDC header is configured to determine the validity of a current state of the buffer before a UDC device (or function) of a reception terminal PDCP layer device performs data decompression. That is, before the reception terminal performs data decompression, the reception terminal identifies the validity of a current reception terminal UDC buffer through checksum bits in a UDC header. If there are no checksum errors, the reception terminal performs data decompression and if there occurs a checksum failure, the reception terminal does not perform data decompression and is required to report the checksum failure to the transmission terminal and recover from the failure.

Even when the reception terminal performs decompression, only if the reception terminal performs decompression in a sequence in which the transmission has performed compression, the decompression may succeed. For example, in a case where the transmission terminal performs UDC compression on pieces of data having PDCP sequence numbers 1, 3, 4, and 5, and does not perform UDC compression on data having PDCP sequence number 2, the reception terminal is also required to perform decompression on received data in a PDCP layer device in an order of PDCP sequence numbers 1, 3, 4, and 5, to successfully perform the decompression. If the transmission terminal performs UDC compression as described above, this performing is indicated by a UDC header, and thus the reception terminal may also determine whether UDC compression is applied, by identifying the UDC header. If a checksum failure has occurred at PDCP sequence number 3 in a procedure of performing a series of UDC decompression as described above, UDC decompression after the failure may be failed all. That is, UDC decompression is unable to be successfully performed on pieces of data having PDCP sequence numbers 4 and 5.

In the following description, the disclosure proposes a checksum failure processing method for solving a checksum failure problem described above.

Figure 9:
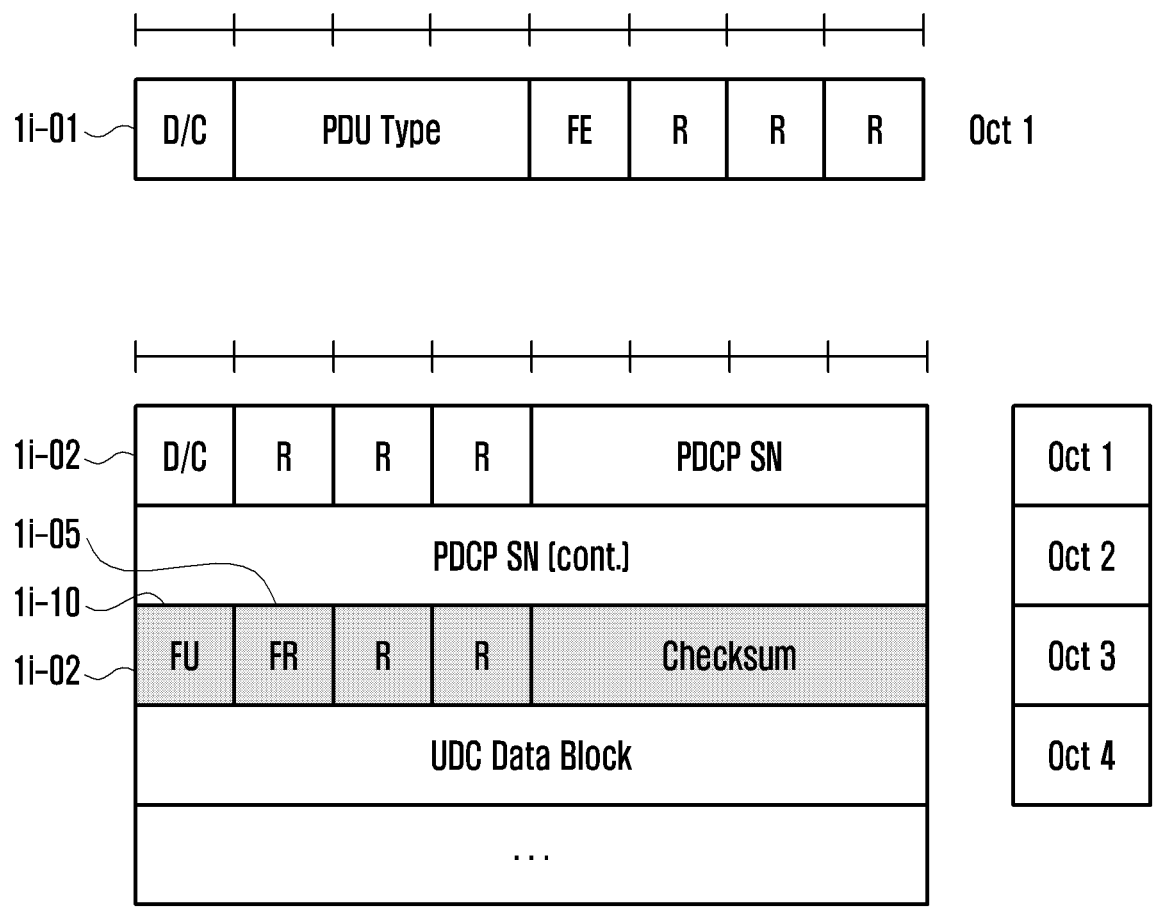
FIG. 9 illustrates a PDCP control PDU format which may be applied in a checksum failure processing method according to the disclosure.

FIG. 9 illustrates a PDCP control PDU format which may be applied in a checksum failure processing method according to the disclosure.

Referring to FIG. 9, a D/C field is used to distinguish between normal data or PDCP layer control information (PDCP control PDU) in a PDCP layer, and a PDU Type field is used to indicate a type of information among pieces of PDCP layer control information described above. A 1-bit indicator (e.g., FE field) indicating whether a checksum failure has occurred or not may be defined and used as a PDCP control PDU format for feedback in a checksum failure processing method proposed in the disclosure, as illustrated by reference numeral 1i-01. If the value of the 1-bit indicator is 0, this may indicate that UDC decompression is being performed normally. If the value of the 1-bit indicator is 1, this may indicate that a checksum failure has occurred during UDC decompression, and indicating initializing (resetting) of a UDC buffer of a transmission PDCP layer device.

In order to define a format 1g-01, reserved values (e.g., 011 or a random reserved value between 100 and 111) may be assigned to a PDU type to define a new PDCP control PDU, and a PDCP control PDU having the defined PDU type may serve as a feedback performing a function of indicating a checksum failure.

TABLE 1

| PDU type | |
|---|---|
| Bit | Description |
| 000 | PDCP status report |
| 001 | Interspersed ROHC feedback packet |
| 010 | LWA status report |
| 011 | UDC checksum failure feedback |
| 100-111 | reserved |

An embodiment proposed in the disclosure, relating to a checksum failure processing method to which a PDCP control PDU proposed in FIG. 9 is applied, is given as follows.

If a reception terminal (base station) identifies a checksum failure of a reception UDC buffer for data to which uplink data compression (UDC) is to be released, the reception terminal transmits a PDCP control PDU to a UE to indicate that a checksum failure has occurred. As the PDCP control PDU, a new PDCP control PDU may be defined and used, and a new indicator may be defined and then included in an existing PDCP control PDU, whereby the existing PDCP control PDU may be modified and used. In another method, an indicator resetting a UDC buffer since a checksum failure has occurred may be defined instead of a PDCP sequence number and may indicate the reset.

Operation of reception terminal: If a checksum failure has occurred, the reception terminal may initialize the UDC buffer immediately. Further, the reception terminal rearranges newly received pieces of data according to PDCP sequence numbers, and then identifies a UDC header of each piece of data in an ascending order of the PDCP sequence numbers. The reception terminal discards pieces of data which includes, in each UDC header, an indicator indicating that a transmission terminal UDC buffer has been reset due to a UDC checksum failure, and which do not include an indication indicating initialization of the reception UDC buffer and are indicated such that UDC compression has been performed. In addition, the UDC header of newly received data does not include an indicator indicating that the transmission terminal UDC buffer is reset due to a UDC checksum failure, and pieces of data indicating that UDC compression has not been performed are all received without a gap in the middle of the PDCP sequence number, the reception terminal may process the pieces of data in an ascending order of the PDCP sequence numbers and then transfer the same to an upper layer device. The reception terminal may initialize the reception UDC buffer from pieces of data which include, in each UDC header, an indicator indicating resetting of the reception UDC buffer and indicating that the transmission terminal UDC buffer has been reset due to a UDC checksum failure, and may restart decompression on UDC-compressed pieces of data in the ascending order of the PDCP sequence numbers.

Operation of transmission terminal: A transmission terminal (UE) may reset (initialize) a UDC transmission buffer when the PDCP control PDU is received; if there are pieces of data (e.g., PDCP PDU), among pieces of data generated through a UDC compression process, which have not been transmitted yet, discard the pieces of data before the initialization of the UDC transmission buffer; perform uplink data compression (UDC) again on pieces of raw data (e.g., PDCP SDU) of the pieces of data which have not been transmitted yet, based on the initialized transmission UDC buffer; update the UDC buffer; include checksum bits in a UDC header; encode the UDC header and data part; generate a PDCP header; and configure a PDCP PDU to transfer the same to a lower layer.

In addition, the transmission terminal may transfer the UDC header or the PDCP header of the newly configured PDCP PDU after including an indicator indicating that the transmission terminal buffer has been reset and an indication initializing the reception terminal buffer, and may newly assign PDCP sequence numbers which have not been transmitted yet, in an ascending order (That is, if data which has been encoded with a PDCP sequence number, a HFN, or a COUNT value and a security key and has been transmitted is encoded again with the same PDCP COUNT value and the security key and is then retransmitted, the risk of hacking increases, and thus a rule in which one PDCP COUNT value allows one time of encoding and transmission may be followed).

In another method, the transmission terminal may reset the transmission UDC buffer when an indication indicating that a checksum failure has occurred is received; newly perform UDC compression only a PDCP PDU to be newly configured, or data having a PDCP sequence number larger than or equal to that of data which has not been transmitted yet to the lower layer from the transmission terminal; and transfer the compressed data or PDCP PDU to the lower layer. In addition, the transmission terminal may transfer a UDC header or a PDCP header of the newly configured PDCP PDU after including an indicator indicating that the transmission terminal UDC buffer has been reset (or an indicator initializing the reception terminal buffer) (That is, if data which has been encoded with a PDCP COUNT value and a security key and has been transmitted is encoded again with the same PDCP COUNT value and the security key and is then retransmitted, the risk of hacking increases, and thus a rule in which one PDCP COUNT value allows one time of encoding and transmission may be followed).

In the above, the disclosure proposes an efficient transmission terminal PDCP layer device operation or a reception terminal PDCP layer device operation for preventing unnecessary data transmission in response to a checksum failure that may occur in the user data compression or decompression procedure.

Specifically, when an uplink data compression procedure (UDC) is configured, the transmission PDCP layer device may apply the uplink data compression procedure to (1-1)th data (e.g., PDCP SDU), among pieces of the first data (e.g., PDCP SDU) received from an upper layer device, and may indicate that the UDC compression procedure has been applied thereto by using the indicator of the UDC header. Further, the transmission PDCP layer device may not apply the UDC procedure to (1-2)th data (e.g., PDCP SDU), and may indicate that the UDC compression procedure has not been applied by using the indicator of the UDC header.

In the above, the (1-1)th data may include general data received from an upper layer device (e.g., an application layer device). On the other hand, the (1-2) data may include data that has already been compressed once in an upper layer device (e.g., an application layer device). Since the data is data that has already been compressed once, the compression rate is not improved even if the UDC compression procedure is applied, and thus the UDC compression procedure may not be applied (whether or not to apply the UDC compression procedure to data may be configured through an RRC message).

In addition, the (1-2)th data may include SDAP control data (SDAP control PDU or end marker) received from an upper layer device (e.g., SDAP layer device), may not allow to apply the UDC compression procedure to the SDAP header or SDAP control to reduce the complexity of UE implementation, and may allow a DU of a base station, which is implemented by a central unit-distributed unit split (CU-DU) structure, to easily read information of SDAP header or SDAP control data.

In the above, with regard to data received from the upper layer device, the PDCP layer device of transmission terminal may apply the uplink data compression procedure to (1-1)th data received from the upper layer device (e.g., PDCP SDU, upper layer device data, or application layer device data) and indicate that the UDC compression procedure has been applied thereto by using the UDC header indicator, thereby generating a PDCP header, and may process the same as (1-2)th data (e.g., PDCP data PDU or PDCP PDU). However, when the SDAP header is configured in the upper SDAP layer device of the PDCP layer device, the UDC compression method is not applied to the SDAP header attached to the data.

In addition, the PDCP layer device of the transmission terminal may not apply the UDC procedure to (2-1) data received from the upper layer device (e.g., PDCP SDU, upper layer device data, or application layer device data) and indicate that the UDC compression procedure has not been applied thereto by using the UDC header indicator, thereby generating a PDCP header, and may process the same as (2-2)th data (e.g., PDCP data PDU or PDCP PDU). In the above, the (2-1)th data may include data of an application layer device, data of an application layer to which a compression function is applied, SDAP control data (SDAP control PDU) of the SDAP layer device, or PDCP control data (PDCP control data) generated by the PDCP layer device. In addition, when the SDAP header of the SDAP layer device is configured, the UDC compression method is not applied to the SDAP header attached to the data.

In the above, a UE stores the data processed as described above (e.g., PDCP data PDU, PDCP PDU, or, for example, (1-2)th data or (2-2)th data) for transmission when an uplink transmission resource is received, and if the PDCP layer device of the transmission terminal (e.g., the UE) receives PDCP control data (feedback indicating UDC checksum failure) indicating a checksum failure, UDC decompression failure, or error from the PDCP layer device of the reception terminal, in order to efficiently process the pieces of data which are pre-generated, stored, or preprocessed (e.g., PDCP data PDU, PDCP PDU, or (1-2)th data or (2-2)th data for example), the transmission PDCP layer device may perform one of the following methods or an application method based on the following methods.

First method: If the UDC compression or decompression procedure is configured in the PDCP layer device of the transmission terminal, and the PDCP layer device of the transmission terminal receives PDCP control data (PDCP control PDU) indicating the occurrence of checksum failure from the PDCP layer device of the reception terminal, the PDCP layer device of the transmission terminal may initialize the transmission UDC buffer for user data compression (UDC compression).

Alternatively, if the UDC compression or decompression procedure is configured in the PDCP layer device and the PDCP layer device of the transmission terminal receives PDCP control data (PDCP control PDU) indicating the occurrence of checksum failure from the PDCP layer device of the reception terminal, the PDCP layer device of the transmission terminal may discard pieces of data for which a PDCP discard timer has not yet expired or which are pre-generated, stored, or pre-processed (e.g., PDCP PDU, PDCP data PDU, (1-2)th data, or (2-2)th data). Alternatively, if the pieces of data (e.g., PDCP PDU, PDCP data PDU, (1-2)th data, or (2-2)th data) are transferred to lower layer devices, the PDCP layer device of the transmission terminal may transmit a data discard indicator regarding the pieces of data (e.g., PDCP PDU, PDCP data PDU, (1-2)th data, or (2-2)th data) to the lower layer device (e.g., the RLC layer device) so as to cause the pieces of data to be discarded.

Alternatively, in the above, when the transmission terminal PDCP layer device transmits the discard indicator to a lower layer device (e.g., an RLC layer device), a discard indicator only for PDCP user data (PDCP data PDU) may be transmitted and a discard indicator for PDCP control data may not be transmitted.

Alternatively, with regard to data (e.g., PDCP PDU, PDCP data PDU, (1-2)th data, or (2-2)th data) that has been discarded but not yet been transmitted in the above procedure, the transmission terminal PDCP layer device may apply the UDC compression method to the (1-1)th data based on the transmission UDC buffer initialized in an ascending order of PDCP SN or COUNT values, regenerate the (1-2)th data, and configure the PDCP sequence number (or new PDC sequence number), which is mapped to the (1-1)th data, in the PDCP header. Alternatively, the transmission terminal PDCP layer device may perform PDCP data processing again for the (2-1)th data in an ascending order of the PDCP SN or COUNT values to regenerate the (2-2)th data, and may configure the PDCP sequence number (or new PDC sequence number), which is mapped to the (2-1)th data, in the PDCP header, so as not to generate a PDCP sequence number gap, or to minimize the same. In the above, the PDCP discard timer corresponding to the (1-1)th data or the (2-1)th data may be driven without being restarted or initialized.

Second method: If the UDC compression or decompression procedure is configured in the PDCP layer device of the transmission terminal, and the PDCP layer device of the transmission terminal receives PDCP control data (PDCP control PDU) indicating the occurrence of checksum failure from the PDCP layer device of the reception terminal, the PDCP layer device of the transmission terminal may initialize the transmission UDC buffer for user data compression (UDC compression). Alternatively, if the UDC compression or decompression procedure is configured in the PDCP layer device and the PDCP layer device of the transmission terminal receives PDCP control data (PDCP control PDU) indicating the occurrence of checksum failure from the PDCP layer device of the reception terminal, the PDCP layer device of the transmission terminal may discard only pieces of the (1-2)th data (or PDCP data PDUs) to which the UDC compression procedure is applied, among pieces of data for which a PDCP discard timer has not yet expired or which are pre-generated, stored, or pre-processed. Alternatively, if the pieces of (1-2)th data (e.g., PDCP PDU or PDCP data PDUs) to which the UDC compression procedure is applied have been transferred to a lower layer device (e.g., RLC layer device), the PDCP layer device of the transmission terminal may transmit a data discard indicator regarding the pieces of (1-2)th data (e.g., PDCP PDU or PDCP data PDU) so as to cause the lower layer device to discard the pieces of (1-2)th data to which the UDC compression procedure is applied.

Alternatively, in the above, when the transmission terminal PDCP layer device transmits the discard indicator to a lower layer device (e.g., an RLC layer device), a discard indicator only for PDCP user data (PDCP data PDU) may be transmitted and a discard indicator for PDCP control data may not be transmitted.

Alternatively, with regard to data (e.g., PDCP PDU, PDCP data PDU, or (1-2)th data) that has been discarded but not yet been transmitted in the above procedure, the transmission terminal PDCP layer device may apply the UDC compression method to the (1-1)th data based on the transmission UDC buffer initialized in an ascending order of PDCP SN or COUNT values, regenerate the (1-2)th data, and configure the PDCP sequence number (or new PDC sequence number), which is mapped to the (1-1)th data, in the PDCP header, so as not to generate a PDCP sequence number gap, or to minimize the same. In the above, the PDCP discard timer corresponding to the (1-1)th data may be driven without being restarted or initialized.

The first method or the second method proposed in the disclosure may be applied to an LTE PDCP layer device or an NR PDCP layer device.

The lower layer device that has received the discard indicator according to the first method or the second method proposed in the disclosure may operate as follows.

As an RLC layer device, if an LTE RLC layer device has received an indicator indicating discarding data (e.g., PDCP user data) from the LTE or NR PDCP layer device in the above, The LTE RLC layer device discards the user data if, with regard to user data (PDCP PDU, PDCP Data PDU, or RLC SDU) received from an upper layer device (PDCP layer device), a part of the user data has not yet mapped to the RLC user data (RLC data PDU) or has not been generated as RLC user data (When indicated from upper layer (i.e. PDCP) to discard a particular RLC SDU, the transmitting side of an AM RLC entity or the transmitting UM RLC entity shall discard the indicated RLC SDU if no segment of the RLC SDU has been mapped to a RLC data PDU yet). Accordingly, if a part of the user data has already mapped to RLC user data (RLC data PDU) or has been generated as RLC user data, the LTE RLC layer device may perform data transmission without discarding the user data.

As an RLC layer device, if an RLC layer device has received an indicator indicating discarding data (e.g., PDCP user data) from the LTE or NR PDCP layer device in the above, The NR RLC layer device discards the user data if, with regard to user data (PDCP PDU, PDCP Data PDU, or RLC SDU) received from an upper layer device (PDCP layer device), the user data or part of the user data has never been transferred or transmitted to a lower layer device (When indicated from upper layer (i.e. PDCP) to discard a particular RLC SDU, the transmitting side of an AM RLC entity or the transmitting UM RLC entity shall discard the indicated RLC SDU, if neither the RLC SDU nor a segment thereof has been submitted to the lower layers). Accordingly, if the user data or a part of the user data has ever been transferred or transmitted to the lower layer device, the NR RLC layer device may perform data transmission without discarding the user data. Therefore, unlike the LTE RLC layer device, even if the user data is generated as RLC user data, if the NR RLC layer device does not transmit the user data to a lower layer device, the user data can be discarded, so that more data can be discarded and unnecessary data transmission can be more effectively prevented.

When the first method or the second method proposed in the disclosure is applied, a gap or difference in PDCP sequence numbers may occur, resulting in a transmission delay due to a reordering timer in the PDCP layer device of the reception terminal. In order to prevent transmission delay due to the reordering timer of the PDCP layer device as described above, one of the following methods or an applied method proposed by the disclosure may be applied.

Third method: In the third method, if the PDCP layer device of the reception terminal is an NR PDCP layer device, or if the PDCP layer device of the reception terminal has a checksum failure relating to the UDC compression method, or has transmitted PDCP control data (PDCP control PDU) due to the checksum failure, the PDCP layer device of the reception terminal may continuously store, in a buffer, pieces of data received thereafter, when receiving the PDCP sequence number of data in which the checksum failure has occurred, the PDCP sequence number greater than the COUNT value, or data corresponding to the COUNT value, until data indicating that an FR bit is configured to be 1 as a result of identification of the FR bit of the UDC header and thus indicating that the transmission UDC buffer is initialized is received. When receiving data corresponding to the PDCP sequence number of the data in which the checksum failure has occurred, or the PDCP sequence number smaller than the COUNT value, or data corresponding to the COUNT value, the PDCP layer device of the reception terminal may identify the indicator of the UDC header and discard the data to which the UDC compression method is applied because UDC decompression for the data may occur.

As another method, by identifying the UDC header for the stored pieces of data, pieces of data to which the UDC compression method is not applied may be processed first and transferred to an upper layer. If the FR bit of the UDC header of the received data is configured to be 1 to indicate data indicating that the transmission UDC buffer is initialized, the reordering timer may be stopped and initialized if the reordering timer is running. Alternatively, from among the stored data, with regard to pieces of data having the PDCP sequence number or COUNT value equal to or greater than the PDCP sequence number or COUNT value of the data in which the FR bit of the UDC header is configured to be 1, the pieces of data may be sequentially processed continuously without a gap in the PDCP sequence number or COUNT value (e.g., applying or not applying a UDC decompression method based on the indicator of a UDC header) and transferred to an upper layer device. In the above, with regard to pieces of data having the PDCP sequence number or COUNT value equal to or greater than the PDCP sequence number or COUNT value of the data in which the FR bit of the UDC header is configured to be 1, if a gap in the PDCP sequence number or COUNT value is identified when the pieces of data are sequentially processed continuously without a gap in the PDCP sequence number or COUNT value, the data is processed as above, and the variable for reordering may be updated with the current reordering variable value or the PDCP sequence number or COUNT value of the first data which is not transmitted to the upper layer device and having the PDCP sequence number or COUNT value greater than that of the data in which the FR bit of the UDC header is configured to be 1. In addition, if a gap between the PDCP sequence number or COUNT value is identified, for example, if the PDCP sequence number or COUNT value expected to be received next is greater than the reordering variable value, the reordering timer may be started or restarted.

Fourth method: In the fourth method, if the PDCP layer device of the reception terminal is an LTE PDCP layer device, or if the PDCP layer device of the reception terminal has a checksum failure relating to the UDC compression method, or has transmitted PDCP control data (PDCP control PDU) due to the checksum failure, the PDCP layer device of the reception terminal may discard pieces of data received thereafter, when receiving the PDCP sequence number of the data in which the checksum failure has occurred, the PDCP sequence number greater than the COUNT value, or data corresponding to the COUNT value, until data indicating that an FR bit is configured to be 1 as a result of identification of the FR bit of the UDC header and thus indicating that the transmission UDC buffer is initialized is received. This is because the LTE RLC layer device arranges the pieces of data in order and transmits the data. As another method, by identifying the UDC header for the stored pieces of data, pieces of data to which the UDC compression method is not applied may be processed first and transferred to an upper layer. If the FR bit of the UDC header of the received data is configured to be 1 to indicate data indicating that the transmission UDC buffer is initialized, the reordering timer may be stopped and initialized if the reordering timer is running. Alternatively, from among the pieces of data received thereafter or the stored data, with regard to pieces of data having the PDCP sequence number or COUNT value equal to or greater than the PDCP sequence number or COUNT value of the data in which the FR bit of the UDC header is configured to be 1, the pieces of data may be sequentially processed continuously without a gap in the PDCP sequence number or COUNT value (e.g., applying or not applying a UDC decompression method based on an indicator of a UDC header) and transferred to an upper layer device. In the above, with regard to pieces of data having the PDCP sequence number or COUNT value equal to or greater than the PDCP sequence number or COUNT value of the data in which the FR bit of the UDC header is configured to be 1, if a gap in the PDCP sequence number or COUNT value is identified when the pieces of data are sequentially processed continuously without a gap in the PDCP sequence number or COUNT value, the data is processed as above, and the variable for reordering may be updated with the current reordering variable value, or the PDCP sequence number or COUNT value of the first data which is not transmitted to the upper layer device or that of the last data which is transmitted to the upper layer and having the PDCP sequence number or COUNT value greater than that of the data in which the FR bit of the UDC header is configured to be 1. In addition, if a gap between the PDCP sequence number or COUNT value is identified, for example, if the PDCP sequence number or COUNT value expected to be received next is greater than the reordering variable value, the reordering timer may be started or restarted.

In the disclosure, an embodiment in which a user data compression method is efficiently performed in a case where an SDAP layer device or an SDAP header is configured by an RRC message is proposed as follows. In the embodiment, a user data compression method is not applied to an SDAP header, the SDAP header is not encoded, and a UDC header is encoded. Further, in the embodiment, the UDC header is attached after the SDAP header, the UDC header is attached immediately before a compressed UDC block, and the SDAP header is attached before the UDC header.

According to the embodiment, through the above described features, QoS information of an SDAP header can be utilized without a procedure of decoding information of the SDAP header by a transmission terminal or a reception terminal. For example, a base station may use the QoS information for scheduling. Further, in a case of implementation of a UE, there is no need to generate an SDAP header at every time when upper layer data is received, a hardware accelerator may perform a UDC process, generate the UDC and attach immediately and perform encoding, and may attach an SDAP header later, so as to facilitate the implementation of a UE.

In addition, a UDC header may be encoded to reinforce security. In addition, by changing the location of the SDAP header and the location of the UDC header in the above embodiment, it is possible to reduce the unnecessary procedure of processing after excluding the SDAP header or processing after removing the SDAP header and then reattaching the SDAP header when performing the user data compression procedure, and one unified procedure can be performed for the UDC header and UDC data block.

Figure 10:
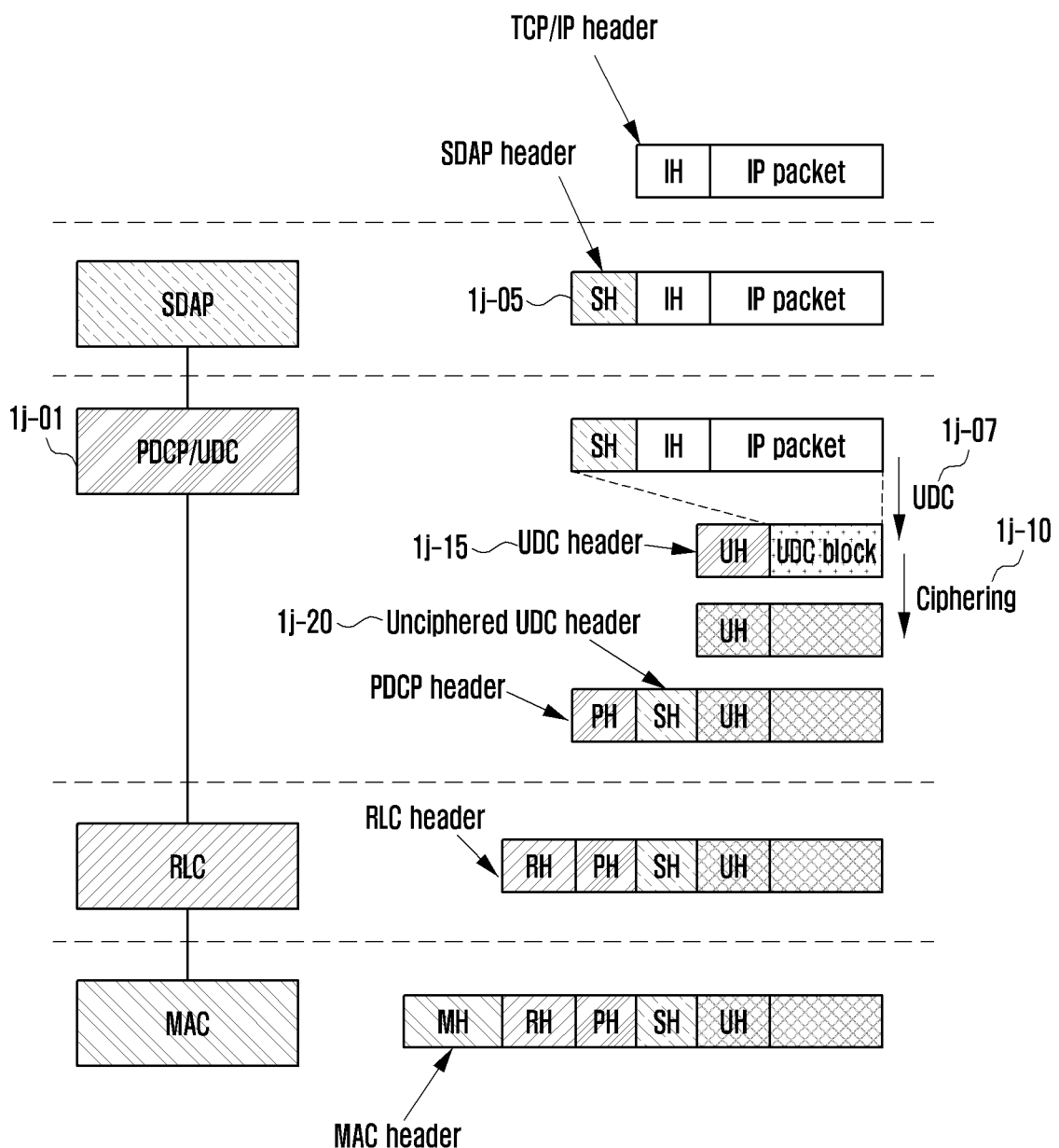
FIG. 10 illustrates an embodiment of efficiently performing a user data compression method when an SDAP layer device is configured or an SDAP header is configured through an RRC message according to the disclosure.

FIG. 10 illustrates an embodiment in which a user data compression method is efficiently performed in a case where an SDAP layer device or an SDAP header is configured through an RRC message according to the disclosure.

Referring to FIG. 10, in case that an SDAP layer device or an SDAP header is configured to be used by an RRC message, for example, in FIG. 5, and that user data compression (UDC) is configured, if the SDAP layer device receives data from an upper layer, the SDAP layer device may generate and configure an SDAP header as indicated by reference numeral 1*j*-05 and transfer the data and the SDAP header to a PDCP layer device. The PDCP layer device may perform a user data compression procedure on a PDCP SDU (SDAP header and IP packet, as indicated by reference numeral 1*j*-06) received from the upper SDAP layer device (indicated by reference numeral 1*j*-07). Further, the PDCP layer device may calculate a checksum field and configure whether UDC has been applied, to generate a UDC header and attach the UDC header immediately before the compressed UDC data block (after the SDAP header) (indicated by reference numeral 1*j*-10). If integrity protection is configured, the PDCP layer device may apply integrity protection to the SDAP header, UDC header, compressed UDC block, and PDCP header before performing an encoding procedure, and then may encode the UDC header and the compressed UDC block. The PDCP layer device may configure data, generate and configure a PDCP header 1*j*-20, concatenate the SDAP header first and concatenate the PDCP header thereto, and then transfer the headers and the data to a lower layer to proceed data processing in an RLC layer device and a MAC layer device.

Figure 11:
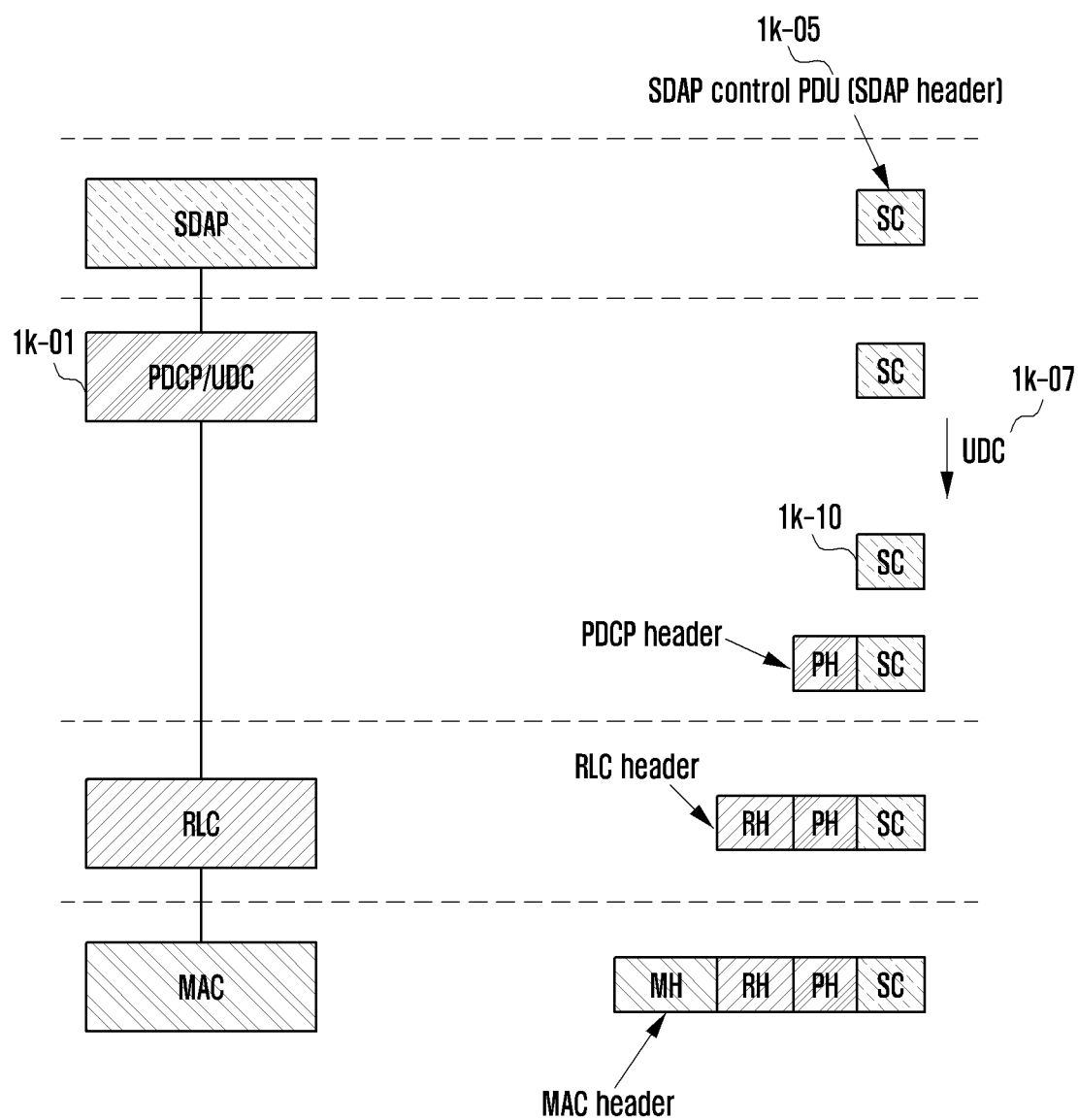
FIG. 11 illustrates an embodiment of efficiently performing a user data compression method and processing SDAP control data when an SDAP layer device is configured or an SDAP header is configured through an RRC message according to the disclosure.

FIG. 11 illustrates an embodiment in which a user data compression method is efficiently performed in a case where an SDAP layer device or an SDAP header is configured through an RRC message according to the disclosure.

Referring to FIG. 11, in case that an SDAP layer device or an SDAP header is configured to be used by an RRC message as in FIG. 5, and that user data compression (UDC) is configured, if the SDAP layer device receives SDAP control data 1*k*-05 from an upper layer, the SDAP layer device may configure the 1-bit D/C field of the SDAP header to be 1 and indicate that SDAP user data (SDAP data PDU) is SDAP user data or SDAP header, and may configure the 1-bit D/C field of the SDAP header to be 0 and indicate that SDAP control data (SDAP control PDU) is SDAP control data. The transmission PDCP layer device may not perform a user data compression procedure on the SDAP control data received from the upper SDAP layer device (indicated by reference numeral 1*o*-07). Further, the transmission PDCP layer device does not generate a UDC header for the SDAP control data (indicated by reference numeral 1*k*-10). In addition, if integrity protection is configured, the transmission PDCP layer device may apply integrity protection to the PDCP header and SDAP control data before performing an encoding procedure, and then does not perform encoding of the SDAP control data. In addition, the transmission PDCP layer device may configure and concatenate a PDCP header to the very front of the SDAP control data, and transmit the data to a lower layer device.

The 1-bit indicator of the PDCP header, the SDAP control data of FIG. 10 or 11, or the 1-bit D/C field of the SDAP header proposed in the embodiment of the disclosure provides a function to indicate the presence or absence of the UDC header, or, when the user compression procedure is not applied to the SDAP header and data received from the upper layer, the UDC header is omitted and the 1-bit indicator of the PDCP header may indicate that the UDC header is not attached so as to reduce the overhead.

In the following of the disclosure, an embodiment proposes an operation of a PDCP layer device of a UE or a base station that performs different data processing by distinguishing a case in which the transmission or reception PDCP layer device extending the embodiments of the disclosure receives an SDAP header and upper layer data from an upper layer device or a lower layer device and a case in which the transmission or reception PDCP layer device receives SDAP control data.

In case that an SDAP layer device or an SDAP header is configured to be used by an RRC message as in FIG. 5, and user data compression (UDC) is configured,
If the data (e.g., PDCP SDU) received from the upper layer device (SDAP layer device) includes the SDAP header and upper layer data, or if the data is not SDAP control data, (When processing the data (PDCP SDU) received from the upper layer device, the transmission PDCP layer device may first identify the 1-bit D/C field of the SDAP header or SDAP control data and distinguish same. In addition, the 1-bit indicator of the UDC header or the 1-bit indicator of the PDCP header may indicate whether it is an SDAP header or SDAP control data (or whether it is compressed). As another method, if the size of the received data exceeds 1 byte, it may be determined that the received data is not SDAP control data and the SDAP header and data are included therein. However, if the size of the received data is 1 byte, it may be determined that the received data is SDAP control data.)
The transmission PDCP layer device performs the procedure of an embodiment of the disclosure (FIG. 10). For example, the transmission PDCP layer device applies the UDC compression procedure except for the SDAP header, performs integrity protection if it is configured, attaches the UDC header after the SDAP header, encodes the UDC header and compressed data except for the SDAP header, concatenates the encoded UDC header and compressed data to the very front of the PDCP header, and transmits the same to the lower layer device.
If the data (e.g., PDCP SDU) received from the upper layer device (SDAP layer device) does not include the SDAP header and upper layer data, or if the data is SDAP control data (When processing the data (PDCP SDU) received from the upper layer device, the transmission PDCP layer device may first identify the 1-bit D/C field of the SDAP header or SDAP control data and distinguish same. In addition, the 1-bit indicator of the UDC header or the 1-bit indicator of the PDCP header may indicate whether it is an SDAP header or SDAP control data (or whether it is compressed). As another method, if the size of the received data exceeds 1 byte, it may be determined that the received data is not SDAP control data and the SDAP header and data are included therein. However, if the size of the received data is 1 byte, it may be determined that the received data is SDAP control data.)
The transmission PDCP layer device performs the procedure of an embodiment (FIG. 11) of the disclosure. For example, the transmission PDCP layer device performs integrity protection if the integrity protection is configured in the SDAP control data, does not apply the UDC compression procedure or encoding procedure, does not generate a UDC header, concatenates the PDCP header thereto, and transmits the same to the lower layer device.
If the data (e.g., PDCP PDU) received from a lower layer device (RLC layer device) includes the SDAP header and upper layer data, or if the data is not SDAP control data, (When processing the data (PDCP PDU) received from the lower layer device, the reception PDCP layer device may first identify the 1-bit D/C field of the SDAP header or SDAP control data and distinguish same. As another method, the 1-bit indicator of the UDC header or the 1-bit indicator of the PDCP header may be identified and distinguished. As another method, the reception PDCP layer device may perform data processing by identifying the size of data received from a lower layer. For example, if the size of the data except for the PDCP header of the received data is 1 byte, SDAP control data may be indicated, and if the data size exceeds 1 byte, SDAP user data (or SDAP header) may be indicated. In another method, SDAP control data may be indicated if the size of data except for the PDCP header is 2 bytes (1 byte UDC header and 1 byte SDAP control data) above, and SDAP user data (or SDAP header) may be indicated if the data size exceeds 2 bytes. In another method, if the size of the data received from the lower layer is equal to the sum of the size of the PDCP header, the size of the UDC header, and the size of the SDAP control data, the SDAP control data may be indicated, and in the above, if the data size exceeds the sum of the size of the PDCP header, the size of the UDC header, and the size of the SDAP control data, the SDAP user data (or SDAP header) may be indicated. As another method, for example, in a case of applying the embodiment of FIG. 11 above, the reception PDCP layer device identifies the size of data received from the lower layer, if the size of the data except for the PDCP header is 1 byte, the reception PDCP layer device may indicate the SDAP control data, and if the data size exceeds 1 byte, the reception PDCP layer device may indicate the SDAP user data (or SDAP header). In another method, if the size of the data received from the lower layer is equal to the sum of the size of the PDCP header and the size of the SDAP control data, the reception PDCP layer device may indicate the SDAP control data, and if the data size exceeds the sum of the size of the PDCP header and the size of the SDAP control data, SDAP user data (or SDAP header) may be indicated.)
The reception PDCP layer device performs the procedure of an embodiment of the disclosure (FIG. 10). For example, the reception PDCP layer device performs a deciphering procedure on the UDC header and data except for the SDAP header, performs integrity protection if it is configured, performs the UDC decompression procedure when there is an indicator indicating that the UDC compression procedure has been applied to the UDC header, and transmits the same to an upper layer device.

If the data (e.g., PDCP PDU) received from a lower layer device (RLC layer device) does not include the SDAP header and upper layer data, or if the data is SDAP control data (when processing the data (PDCP PDU) received from the lower layer device, the reception PDCP layer device may first identify the 1-bit D/C field of the SDAP header or SDAP control data and distinguish same. As another method, the 1-bit indicator of the UDC header or the 1-bit indicator of the PDCP header may be identified and distinguished. As another method, the reception PDCP layer device may perform data processing by identifying the size of data received from a lower layer. For example, if the size of the data except for the PDCP header of the received data is 1 byte, SDAP control data may be indicated, and if the data size exceeds 1 byte, SDAP user data (or SDAP header) may be indicated. In another method, SDAP control data may be indicated if the size of data except for the PDCP header is 2 bytes (1 byte UDC header and 1 byte SDAP control data) above, and SDAP user data (or SDAP header) may be indicated if the data size exceeds 2 bytes. In another method, if the size of the data received from the lower layer is equal to the sum of the size of the PDCP header, the size of the UDC header, and the size of the SDAP control data, the SDAP control data may be indicated, and in the above, if the data size exceeds the sum of the size of the PDCP header, the size of the UDC header, and the size of the SDAP control data, the SDAP user data (or SDAP header) may be indicated. As another method, for example, in a case of applying the embodiment of FIG. 11 above, the reception PDCP layer device identifies the size of data received from the lower layer, if the size of the data except for the PDCP header is 1 byte, the reception PDCP layer device may indicate the SDAP control data, and if the data size exceeds 1 byte, the reception PDCP layer device may indicate the SDAP user data (or SDAP header). In another method, if the size of the data received from the lower layer is equal to the sum of the size of the PDCP header and the size of the SDAP control data, the reception PDCP layer device may indicate the SDAP control data, and if the data size exceeds the sum of the size of the PDCP header and the size of the SDAP control data, SDAP user data (or SDAP header) may be indicated.)

The reception PDCP layer device performs the procedure of an embodiment of the disclosure (FIG. 11). For example, the reception PDCP layer device does not perform a decoding procedure for the SDAP control data, performs integrity protection if it is configured, does not perform the UDC decompression procedure because there is no UDC header and UDC compression is not applied to the SDAP control data, and transmits the same to the lower layer device.

Figure 12:
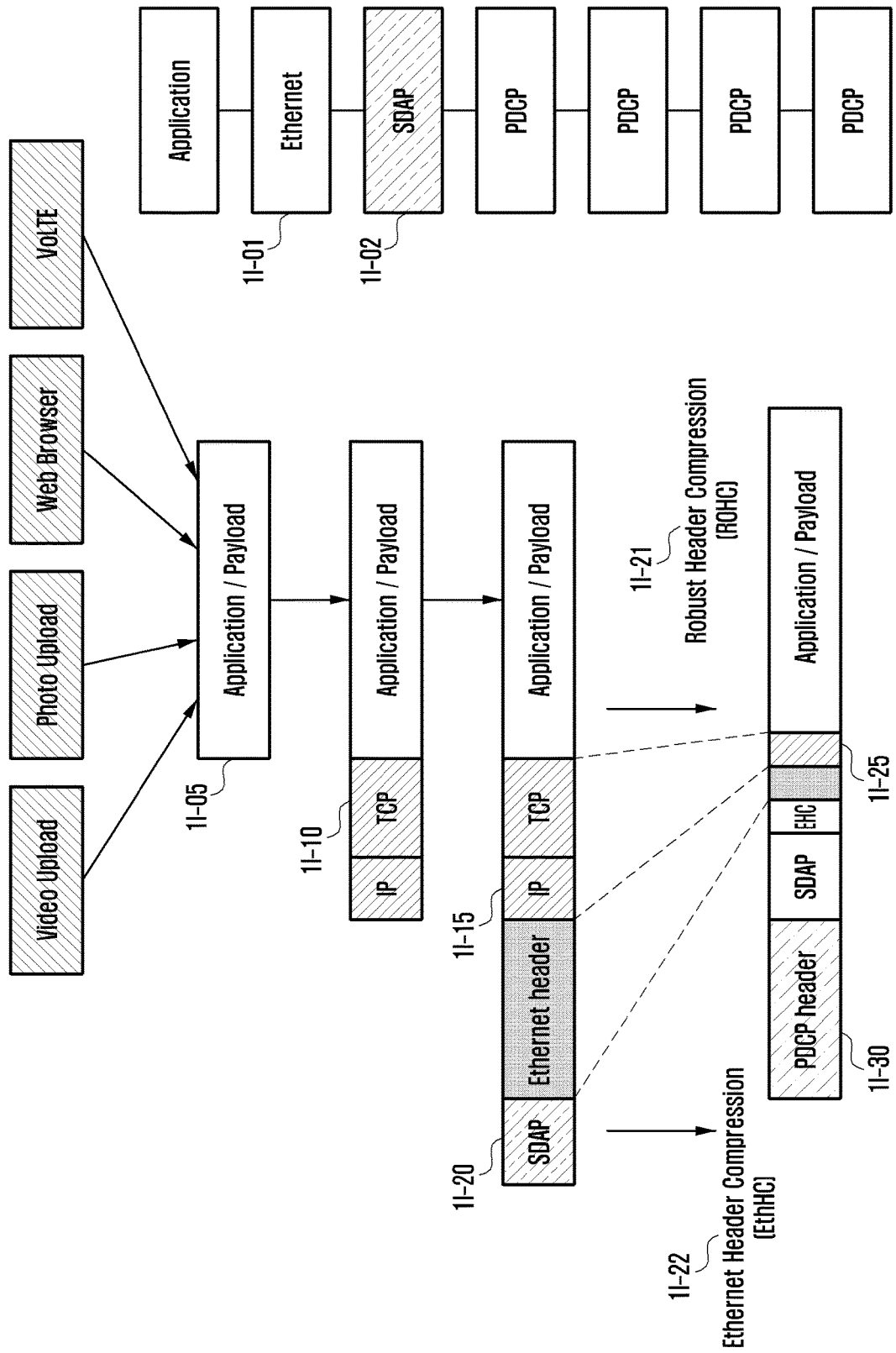
FIG. 12 illustrates an Ethernet header compression method (EthHC) proposed when an SDAP header or a layer device is configured according to the disclosure.

FIG. 12 illustrates an Ethernet header compression (EthHC) method proposed when an SDAP header or a layer device is configured according to the disclosure.

In FIG. 12, uplink data 1*l*-05 may be generated as data corresponding to services, such as video transmission, photo transmission, web search, and VoLTE. Pieces of data generated by an application layer device may be processed through TCP/IP or UDP corresponding to a network data transport layer, or may be processed through the Ethernet protocol and an SDAP layer device, may configure respective headers 1*l*-10, 1*l*-15, and 1*l*-20 (an upper layer header, an Ethernet header, or an SDAP header) and may be transferred to a PDCP layer. When the PDCP layer receives data (PDCP SDU) from an upper layer, the PDCP layer may perform the following procedure.

When the header compression (ROHC) or Ethernet header compression procedure is configured to be used in the PDCP layer through RRC messages as in FIG. 5, the PDCP layer may compress a TCP/IP header via ROHC as shown in reference numeral 1*l*-21, and may perform the Ethernet header compression procedure for the Ethernet header, except for the SDAP header, in the PDCP layer device as shown in reference numeral 1*l*-22. Further, the PDCP layer may configure a separate EHC header, which includes a field for indicating whether to compress the Ethernet header, a field for indicating which fields of the Ethernet header are compressed (omitted) or not compressed (non-omitted), or a context identifier as shown in reference numeral 1*l*-40, and may configure the separate EHC header before the compressed header.

When the integrity verification is configured, the PDCP layer may perform integrity protection for an SDAP header, a PDCP header, an EHC header, compressed headers, and data. In addition, the PDCP layer may perform a ciphering procedure for compressed headers, data, and the EHC header except for the SDAP header, and may configure a PDCP PDU by configuring a PDCP header 1*l*-30. A reception terminal may perform a deciphering procedure for compressed headers, data, and the EHC header except for the SDAP header in a reception PDCP layer device. In addition, when an integrity protection or verification procedure is configured, the reception terminal may perform integrity verification for the PDCP header, EHC header, compressed headers, and data. In the above, the PDCP layer device includes a header compressor/decompressor, determines whether to perform header compression on each data as configured through the RRC message, and uses the header compressor/decompressor.

The transmission terminal compresses the Ethernet header or upper layer header (e.g., a TCP/IP header) using the header compressor in the transmission PDCP layer device, and the reception terminal performs header decompression for the Ethernet header or upper layer header (e.g., a TCP/IP header) by using the header decompressor in the reception PDCP layer device. In the above, the ciphering procedure or the deciphering procedure may be applied to an EHC header excluding the PDCP header or SDAP header, an Ethernet header compressed by the Ethernet header compression method, an upper layer header compressed by the ROHC header compression method, or the remaining data. In addition, the integrity protection or verification procedure may be applied to a PDCP header, SDAP header, EHC header, an Ethernet header compressed by an Ethernet header compression method, an upper layer header compressed by an ROHC header compression method, or the remaining data.

The procedure of FIG. 12 described above may be applied to a case where a UE performs downlink data header compression as well as uplink header compression. In addition, a description of uplink data may be equally applied to downlink data.

A method for performing Ethernet header compression on the Ethernet header proposed by the disclosure is a method for reducing the header size by indicating only pieces of information changed or to be changed and omitting fields indicating or having fixed information. Therefore, at first, information including the full header information and configuration information for compression (for example, a traffic (or service)-specific identifier (type) for the Ethernet protocol, a traffic (or service)-specific serial number, information related to a compression rate, or an indicator indicating whether compression occurs) may be transmitted. In addition, fields (for example, a transmission address field or a reception address field (MAC address), a preamble field, start of frame delimiter (SFD), frame checksum (FCS), Ethernet type field, Q-Tage field, etc.) corresponding to unchanged information in comparison with full information transmitted at first or fixed information may be omitted or may not be transmitted, and the header may be configured by including only fields corresponding to changed information or information that can be changed, so as to reduce the size of the header. Alternatively, header fields may be compressed when receiving feedback in response to successful reception of data having the full header, or fields (for example, a transmission address field or a reception address field (MAC address), a preamble field, start of frame delimiter (SFD), frame checksum (FCS), Ethernet type field, Q-Tage field, etc.) corresponding to unchanged information in comparison with full information transmitted at first or fixed information may be omitted or may not be transmitted, and the header may be configured by including only fields corresponding to changed information or information that can be changed, so as to reduce the size of the header.

As another method, since compressible fields and non-compressible fields are distinguished, and the values of the compressible fields may be assumed to include the same values as the field values of the full header transmitted at first, only the compressible fields may be compressed (or omitted) and transmitted, and non-compressible fields may always be transmitted without being compressed (or omitted). In addition, when even one field among the compressible fields has a value having been changed from a field value of the previously transmitted full header, the full header can be transmitted again. In addition, each time the full header is received, the reception PDCP layer device may always transmit feedback indicating that the full header is received well to a transmission PDCP layer device.

The Ethernet header compression method proposed in the above may not be applied to SDAP control data (SDAP control PDU) and SDAP header of an upper layer device. Therefore, in network implementation, uncompressed SDAP control data or QoS information of the SDAP header can be read and transmission resources can be quickly scheduled. Further, in UE implementation, since QoS information can be read from SDAP control data or SDAP header before decompression occurs at the reception terminal, implementation can be simplified. In addition, since the transmission terminal can perform the generation of SDAP control data or SDAP header in parallel with the header, data compression processing procedure, or ciphering procedure of the PDCP layer device, data processing time can be reduced.

In addition, the transmission PDCP layer device or the reception PDCP layer device may identify the 1-bit indicator of the SDAP header of data received from an upper layer device or a lower layer device to distinguish whether it is SDAP control data (SDAP control PDU) or SDAP user data (SDAP data PDU) having an SDAP header, and may perform data processing as described above. In another method, the transmission PDCP layer device or the reception PDCP layer device may identify the size of data received from the upper layer device or the lower layer device (for example, whether the data size exceeds 1 byte, when the data size is 1 byte, it may be determined as SDAP control data, and when the data size exceeds 1 byte, it may be determined as SDAP user data) to distinguish whether it is SDAP control data (SDAP control PDU) or SDAP user data having an SDAP header (SDAP data PDU), and may perform data processing as described above.

In the following of the disclosure, with regard to a data service assuming data loss or when a UDC compression method or a user data compression procedure is applied in a PDCP layer device connected to or configured in an RLC UM mode, methods enabling a user data compression procedure that is not sensitive to loss to be performed are proposed.

In the disclosure, a UDC compression method considering loss or the first method of performing user data compression is as follows.

According to the first method, a new second timer value may be configured through an RRC message as in FIG. 5, and the second timer may be configured or applied together when a data compression method (e.g., uplink data compression (UDC)) is configured in the bearer or PDCP layer device. The second timer value may be configured to be a value smaller than the first timer value, and may be triggered or started when a sequence number gap occurs when the reception PDCP layer device rearranges the received pieces of data based on the PDCP sequence number or the COUNT value in ascending order. In addition, when the sequence number gap is filled, the second timer may be stopped. When the second timer expires because the sequence number gap is not filled, the reception PDCP layer device may include, in the PDCP control data (PDCP control PDU), an instruction to initialize a buffer for the data compression method or information indicating that data decompression failure has occurred and transmit the same to the transmission PDCP layer device; and the reception PDCP layer device may immediately initialize a buffer for the data compression method, or may initialize the buffer for the data compression method upon receiving, from the transmission PDCP layer device, an instruction to initialize the buffer for the data compression method or indicating that the buffer has been initialized. In the above, the second timer value may be configured in consideration of a retransmission time of the MAC layer device or the RLC layer device or a time taken until successful transfer is identified. In addition, when the second timer expires in the above, the reception PDCP layer device may discard pieces of data, which are received before receiving an instruction to initialize the buffer for the data compression method or indicating that the buffer has been initialized from the transmission PDCP layer device, without performing a decoding or user data decompression procedure therefor.

In the disclosure, a UDC compression method considering loss or the second method of performing user data compression is as follows.

According to the second method, a new third timer value may be configured through an RRC message as in FIG. 5, and the third timer may be configured or applied together when a data compression method (e.g., uplink data compression (UDC)) is configured in the bearer or PDCP layer device. The third timer value may be configured to be a value smaller than the first timer value, and the reception PDCP layer device may start a third timer when the third timer value is configured. The third timer may be used when the reception PDCP layer device includes, in the PDCP control data (PDCP control PDU), an instruction to initialize a buffer for a data compression method and periodically transmit the same to the transmission PDCP layer device. That is, whenever the third timer expires (whenever the number of data, which is compressed by another method or to which UDC procedure is applied and transferred to the lower layer, reaches the maximum number of data), the reception PDCP layer device may transmit an instruction to initialize the buffer for the data compression method to the transmission PDCP layer device by including the same in the PDCP control data (PDCP control PDU). In addition, the reception PDCP layer device may restart the third timer immediately after transmitting the PDCP control data or after the timer expires, or upon receiving an instruction to initialize the buffer for the data compression method or indicating that the buffer has been initialized from the transmission PDCP layer device.

As another method, the third timer may be applied to a transmission PDCP layer device, and the transmission PDCP layer device may start the third timer to periodically initialize a buffer for the data compression method. That is, whenever the third timer expires, the transmission PDCP layer device may initialize the buffer for the data compression method, and configure and transmit a 1-bit indicator of the UDC header, so as to instruct the reception PDCP layer device to initialize the buffer or provide an indication that the buffer is initialized. In addition, the transmission PDCP layer device may restart the third timer immediately after initializing the buffer or after the timer expires, or after configuring a 1-bit indicator in the UDC header and transmitting. In the above, the third timer value may be configured in consideration of the retransmission time of the MAC layer device or the RLC layer device or the time taken until the successful transfer is identified. In addition, when the third timer expires in the above, pieces of data, which are received before receiving an instruction to initialize the buffer for the data compression method or indicating that the buffer has been initialized from the transmission PDCP layer device, are discarded without performing a decoding or user data decompression procedure therefor.

In the disclosure, a UDC compression method considering loss or the third method of performing user data compression is as follows.

The third method may include configuration information about a predefined library or dictionary, which is to be input and used in a buffer when performing the data compression method, and information indicating whether to perform the data compression or decompression procedure while updating the buffer with a series of packets by inputting the library or dictionary information into the buffer and performing compression at the beginning of starting the data compression or decompression method, or indicating whether to perform data compression or decompression procedures based on a fixed buffer value by inputting the predefined library or dictionary information to the buffer for data compression or decompression, no longer updating the buffer with a series of data, and maintaining the library or dictionary information as the fixed buffer value. Therefore, if the indicator to use the fixed buffer value is configured in the above, the transmission PDCP layer device may apply the user data compression procedure to pieces of data by using a fixed buffer value without continuously updating the buffer with pieces of data to which user data compression is applied, unlike that described in FIG. 7 or FIG. 8. Further, the reception PDCP layer device does not update the buffer value each time the user data decompression procedure is performed on the received data, and may also perform a user data decompression procedure by using the fixed buffer value in the same manner as the transmission PDCP layer device and applying the fixed buffer value to received pieces of data. In the disclosure, a UDC compression method considering loss or a fourth method of performing user data compression is as follows.

The fourth method may include configuration information on an RLC layer device connected to a PDCP layer device to which the data compression method is applied. The configuration information for the RLC layer device may include an indicator or information indicating whether to transfer pieces of data, which are received in the reception operation of the RLC layer device, to the PDCP layer device by arranging the order of the received pieces of data based on the RLC sequence number (in-sequence delivery function configuration); or whether to transmit data that has not been divided or reassembled data, with regard to the received pieces of data, to the PDCP layer device regardless of the order of the RLC sequence number (out-of-sequence delivery function configuration). Therefore, if the RLC layer device is configured based on the in-sequence delivery function in the above, the reception PDCP layer device may trigger and configure PDCP control data indicating that a user data decompression error has occurred if a sequence number gap occurs when reordering received pieces of data in an ascending order based on the PDCP sequence number or COUNT value, and may transmit the PDCP control data to the transmission PDCP layer device. That is, the reception PDCP layer device may include, in the PDCP control data (PDCP control PDU), an instruction to initialize a buffer for the data compression method or information indicating that data decompression failure has occurred and transmit the same to the transmission PDCP layer device; and the reception PDCP layer device may immediately initialize a buffer for the data compression method, or may initialize the buffer for the data compression method upon receiving, from the transmission PDCP layer device, an instruction to initialize the buffer for the data compression method or indicating that the buffer has been initialized. In addition, if a gap in the PDCP sequence number or COUNT value occurs in the above, the reception PDCP layer device may discard pieces of data, which are received before receiving an instruction to initialize the buffer for the data compression method or indicating that the buffer has been initialized from the transmission PDCP layer device, without performing a decoding or user data decompression procedure therefor.

In the disclosure, when a PDCP discard timer is driven in a transmission terminal PDCP layer device, and data, which has not been transmitted due to the expiration of the PDCP discard timer and to which a user compression procedure (UDC) has been applied, is discarded, a UE operation is as follows.

In detail, each time a UE receives data from an upper layer device, the UE may drive the PDCP discard timer for each received data. The UE performs uplink data compression on the received data (PDCP SDU) if it is configured to perform uplink data compression on the PDCP layer device. Further, the UE performs uplink data compression (UDC), updates the buffer according to the data compression, and configures a transmission UDC buffer. When uplink data compression (UDC) is performed in the above, the UE may compress the PDCP SDU received from the upper layer into UDC compressed data (UDC block) having a smaller size. Further, the UE configures a UDC header for the compressed UDC compressed data. The UDC header may include an indicator indicating whether uplink data compression has been performed or not (e.g., a 1-bit indicator in the UDC header is 0, it may indicate that UDC is applied, and the 1-bit indicator is 1, it may indicate that UDC is not applied).

If uplink data compression (UDC) is performed on the data (PDCP SDU) received from the upper layer and the UDC buffer is updated, the reception terminal PDCP layer device may calculate checksum bits in order to identify the validity of the updated UDC buffer, and include the checksum bits in the UDC buffer (the checksum bits may have a predetermined length and configured by 4 bits for example).

The UE performs integrity protection for data to which uplink data decompression is applied or not applied in the above, if it is configured, performs ciphering of the data, and transfers the ciphered data to a lower layer.

If the transmission PDCP layer device discards data, which has not yet been transmitted due to the expiration of the PDCP discard timer and on which UDC compression is performed, the UE may transmit data corresponding to the next PDCP sequence number of the discarded data, may discard the remaining pieces of data (stored pieces of data having a PDCP sequence number greater than the next PDCP sequence number of the discarded data, to which user data compression has been applied and not yet been transmitted), and may transmit an indicator to discard the pieces of data to a lower layer device if the pieces of data have already been delivered to the lower layer device. The UE may stop data transmission to the transmission PDCP layer device until a PDCP control PDU indicating that a checksum failure has occurred is received. Because the intermediate or partial data of the pieces of UDC-compressed data is discarded, user data compression has been performed in advance, and with regard to pieces of data (e.g., PDCP PDU) having a higher PDCP sequence number than the discarded data, it is obvious that a checksum failure is to occur in the reception PDCP layer device. Therefore, when data corresponding to the next PDCP sequence number of the discarded data is transmitted, it can be expected that the reception PDCP layer device is to identify the checksum failure and transmit the PDCP control PDU.

Therefore, when the transmission PDCP layer device receives the PDCP control PDU indicating that a checksum failure has occurred or before receiving the PDCP control PDU, the transmission PDCP layer device may initialize a transmission buffer for user data compression (if the transmission UDC buffer has already been initialized above, it is not initialized), may perform user data compression procedure again starting from data for which the PDCP discard timer has not yet expired and which has not yet been transmitted, or from the last data transmitted for which the PDCP discard timer has not yet expired (data corresponding to the next PDCP sequence number of discarded data and transmitted), and may cipher, generate, and prepare data (e.g., PDCP PDU) by allocating in an ascending order starting from a new PDCP sequence number or the first PDCP sequence number that has not yet been transmitted. Transmission of the newly generated and prepared data may be resumed in the transmission PDCP layer device after receiving the PDCP control PDU indicating that the checksum failure has occurred. That is, data can be delivered to a lower layer device.

Figure 13:
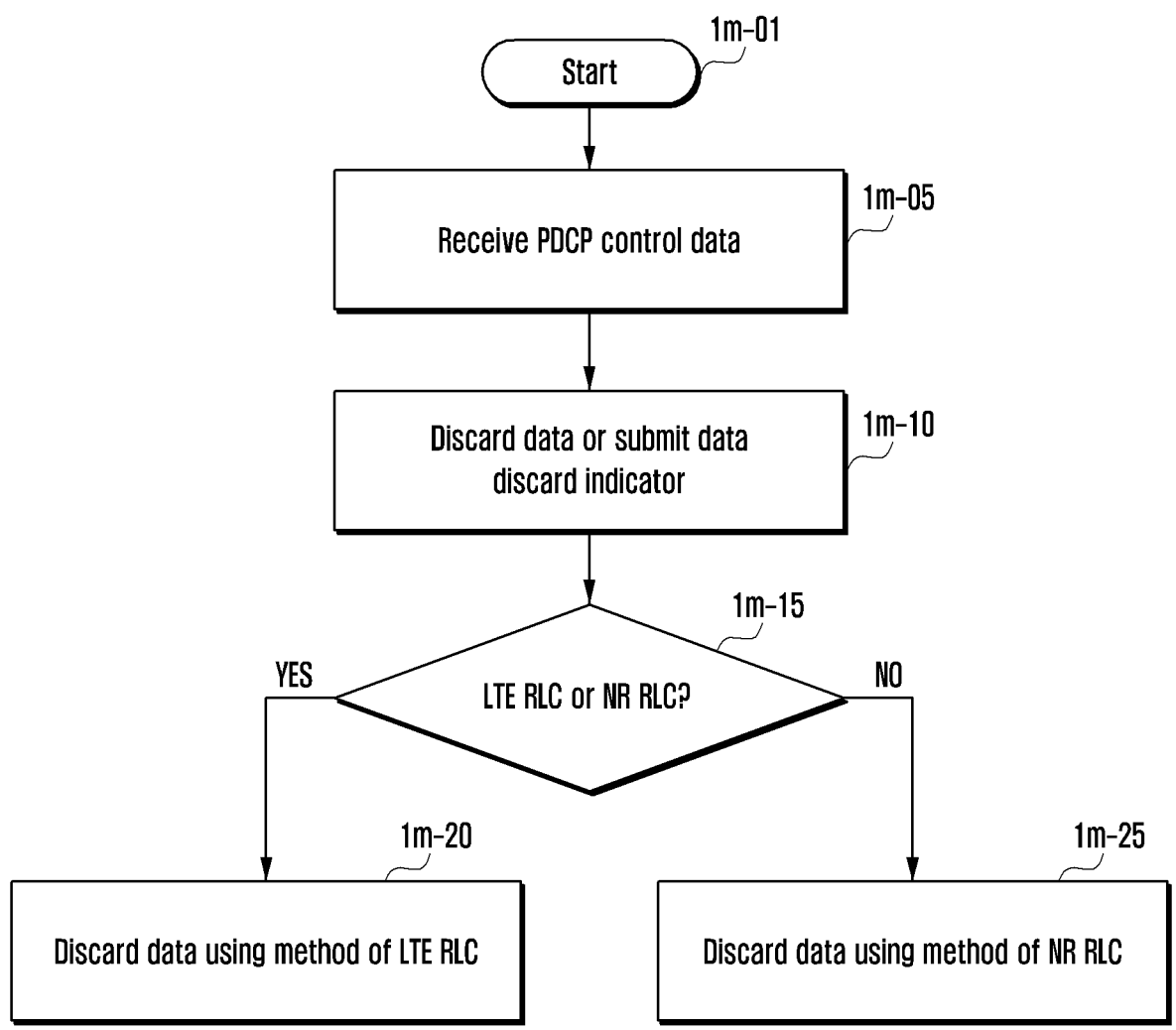
FIG. 13 illustrates an operation of a UE according to the disclosure.

FIG. 13 illustrates an operation of a UE in the disclosure.

Figure 14:
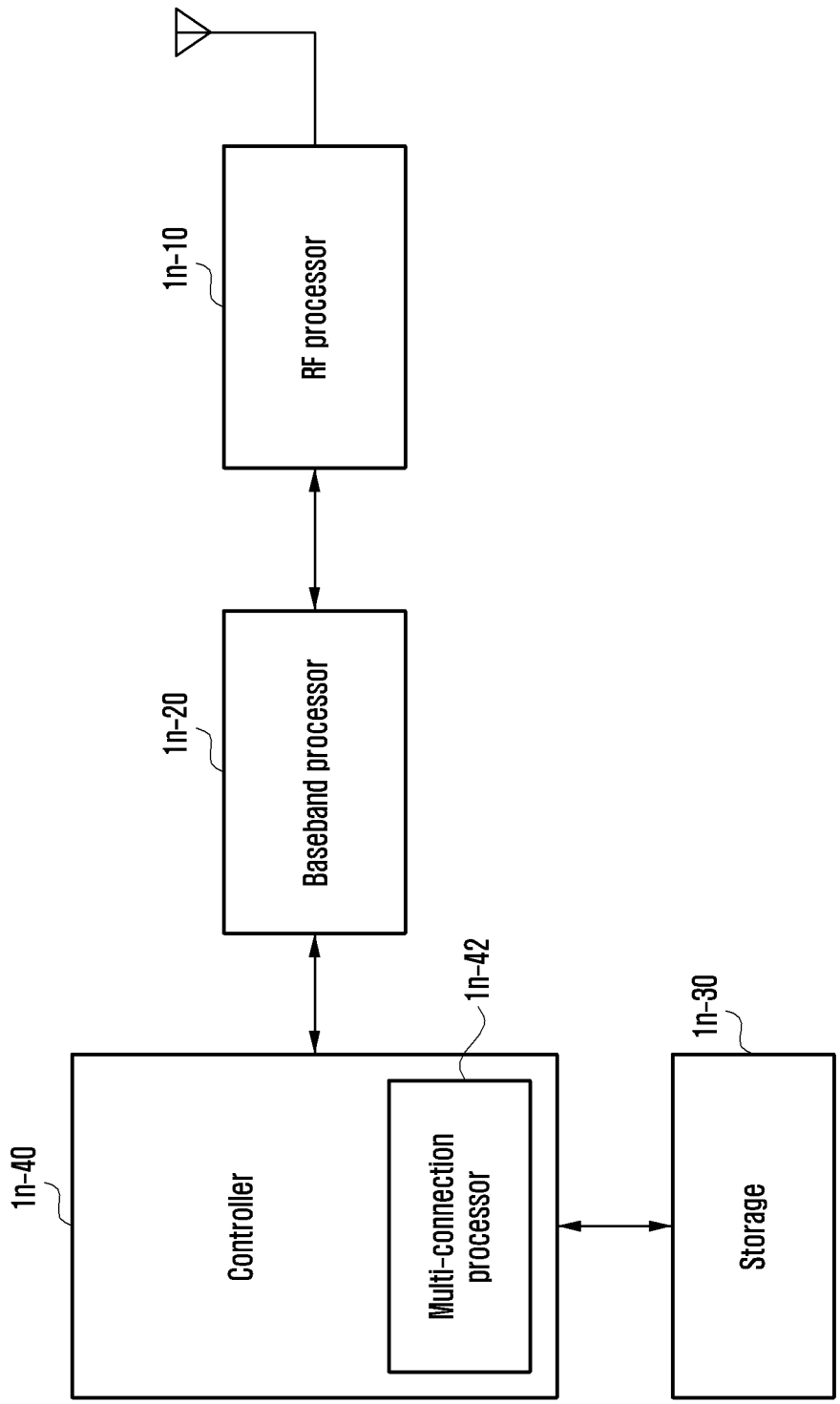
FIG. 14 illustrates the structure of a UE to which an embodiment according to the disclosure can be applied.

If a UDC compression or decompression procedure is configured in a PDCP layer device of a transmission terminal of a UE $1m$-01, and the PDCP layer device of the transmission terminal receives PDCP control data (PDCP control PDU) indicating that a checksum failure has occurred from a PDCP layer device of a reception terminal (operation $1m$-05), the PDCP layer device of the transmission terminal may initialize the transmission UDC buffer for user data compression (UDC compression). Alternatively, if the UDC compression or decompression procedure is configured in the PDCP layer device, and the PDCP layer device of the transmission terminal receives PDCP control data (PDCP control PDU) indicating that a checksum failure has occurred from the PDCP layer device of the reception terminal, a data discard procedure may be performed by applying the first method or the second method proposed in the disclosure to data which has been pre-generated, has been stored, has been pre-processed, or for which the PDCP discard timer has not yet expired (operation $1m$-10). In addition, if an RLC layer device, which has received the data discard indicator in the data discard procedure, is an LTE RLC layer device (operation $1m$-15), the data discard method of the LTE RLC layer device proposed above in the disclosure can be applied (operation $1m$-20), an if the RLC layer device, which has received the data discard indicator in the data discard procedure, is an NR RLC layer device (operation $1m$-15), the data discard method of the NR RLC layer device proposed above in the disclosure can be applied (operation $1m$-25). FIG. 14 shows the structure of a UE to which an embodiment of the disclosure can be applied.

Referring to the drawing, the UE may include a radio frequency (RF) processor $1n$-10, a baseband processor $1n$-20, a storage $1n$-30, and a controller $1n$-40.

The RF processor $1n$-10 may perform a function for transmitting and receiving a signal through a wireless channel such as band conversion, amplification, and the like of a signal. That is, the RF processor $1n$-10 may up-convert a baseband signal provided from the baseband processor $1n$-20 into an RF band signal and may transmit the RF band signal through an antenna, and may down-convert the RF band signal received through the antenna into a baseband signal. For example, the RF processor $1n$-10 may include a transmission filter, a reception filter, an amplifier, a mixer, an oscillator, a digital to analog convertor (DAC), an analog to digital convertor (ADC), and the like. In the drawing, only one antenna is shown, but the UE may include multiple antennas. In addition, the RF processor $1n$-10 may include multiple RF chains. In addition, the RF processor $1n$-10 may perform beamforming. For the beamforming, the RF processor $1n$-10 may adjust the phase and magnitude of each of signals transmitted and received through multiple antennas or antenna elements. In addition, the RF processor may perform MIMO and may receive multiple layers when performing the MIMO operation. The RF processor $1n$-10 may perform reception beam sweeping by appropriately configuring multiple antennas or antenna elements under the control of the controller, or may adjust the direction and beam width of the reception beam so that the reception beam is coordinated with transmission beam.

The baseband processor $1n$-20 may perform a conversion function between a baseband signal and a bit string according to a physical layer standard of the system. For example, during data transmission, the baseband processor $1n$-20 generates complex symbols by encoding and modulating a transmission bit string. In addition, during data reception, the baseband processor $1n$-20 may reconstruct the received bit string by demodulating and decoding a baseband signal provided from the RF processor $1n$-10. For example, according to an orthogonal frequency division multiplexing (OFDM) scheme, during data transmission, the baseband processor $1n$-20 may generate complex symbols by encoding and modulating a transmission bit string, may map the complex symbols to subcarriers, and may then configure OFDM symbols through an inverse fast Fourier transform (IFFT) operation and cyclic prefix (CP) insertion. In addition, during data reception, the baseband processor 1n-20 may divide the baseband signal provided from the RF processor 1n-10 into units of OFDM symbols, may reconstruct the signals mapped to the subcarriers through a fast Fourier transform (FFT) operation, and may then reconstruct the received bit string through demodulation and decoding.

The baseband processor 1n-20 and the RF processor 1n-10 may transmit or receive signals as described above. Accordingly, the baseband processor 1n-20 or the RF processor 1n-10 may be referred to as a transmitter, a receiver, a transceiver, or a communication unit. Further, at least one of the baseband processor 1n-20 and the RF processor 1n-10 may include multiple communication modules to support multiple different radio access technologies. In addition, at least one of the baseband processor 1n-20 and the RF processor 1n-10 may include different communication modules to process signals of different frequency bands. For example, the different radio access technologies may include an LTE network, an NR network, and the like. In addition, the different frequency bands may include a super high frequency (SHF) (e.g., 2.5 GHz or 5 GHz) band and a millimeter wave (e.g., 60 GHz) band.

The storage 1n-30 may store data such as a basic program, an application program, and configuration information for the operation of the UE. The storage 1n-30 may provide stored data according to a request from the controller 1n-40.

The controller 1n-40 may control overall operations of the UE. For example, the controller 1n-40 may transmit or receive signals through the baseband processor 1n-20 or the RF processor 1n-10. In addition, the controller 1n-40 may record and read data in the storage 1n-30. To this end, the controller 1n-40 may include at least one processor. For example, the controller 1n-40 may include a communication processor (CP) for performing control for communication and an application processor (AP) for controlling an upper layer such as an application program.

Figure 15:
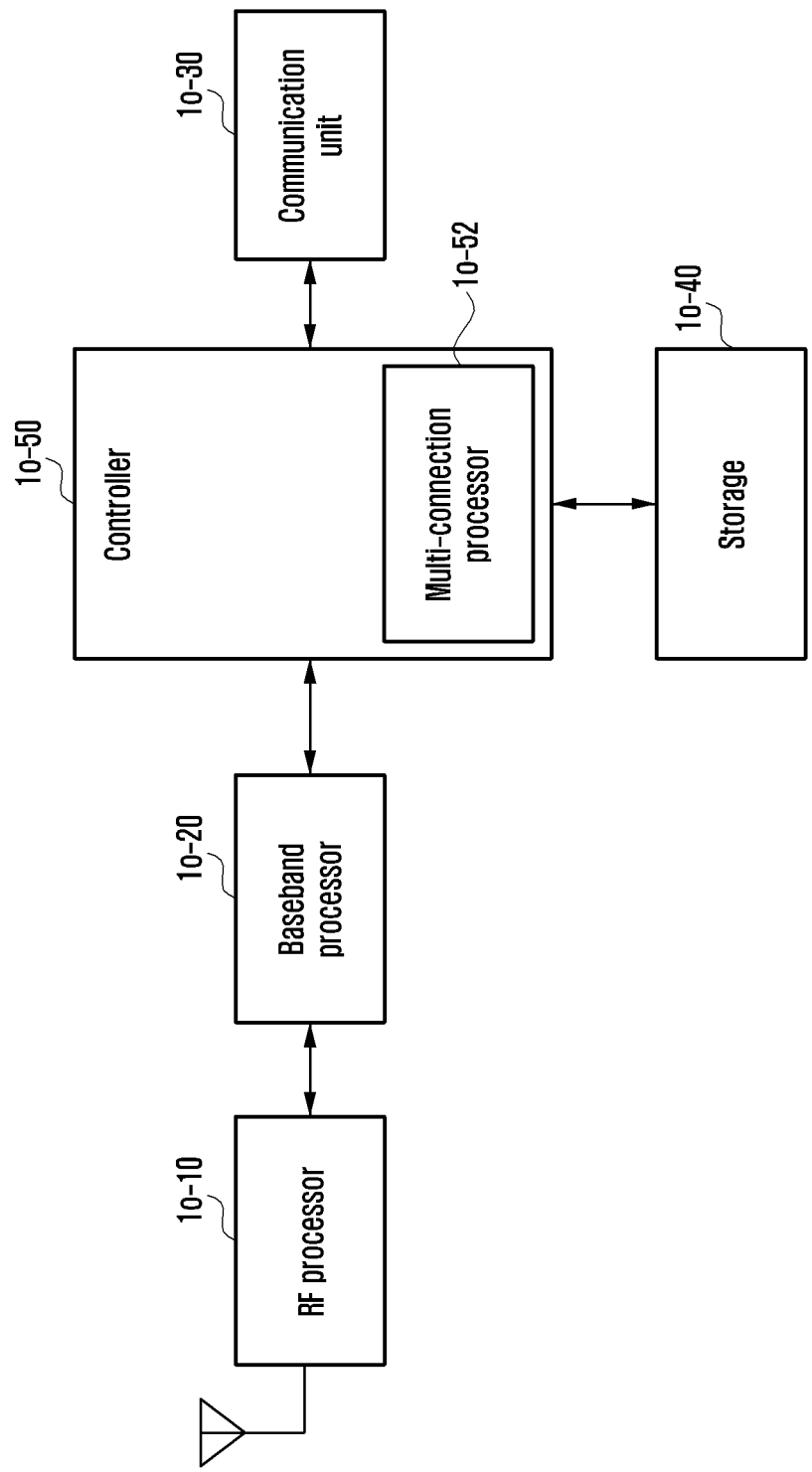
FIG. 15 illustrates a block configuration of a TRP in a wireless communication system to which an embodiment according to the disclosure can be applied.

FIG. 15 is a block diagram illustrating a TRP in a wireless communication system to which the disclosure can be applied.

As shown in FIG. 15, the base station may include an RF processor 1o-10, a baseband processor 1o-20, a communication unit 1o-30, a storage 1o-40, and a controller 1o-50.

The RF processor 1o-10 may perform a function for transmitting or receiving a signal through a wireless channel such as band conversion, amplification, and the like of a signal. That is, the RF processor 1o-10 may up-convert a baseband signal provided from the baseband processor 1o-20 into an RF band signal to transmit the RF band signal through an antenna, and may down-convert the RF band signal received through the antenna into a baseband signal. For example, the RF processor 1o-10 may include a transmission filter, a reception filter, an amplifier, a mixer, an oscillator, a DAC, an ADC, and the like. In the drawing, only one antenna is shown, but the base station may have multiple antennas. In addition, the RF processor 1o-10 may include multiple RF chains. In addition, the RF processor 1o-10 may perform beamforming. For the beamforming, the RF processor 1o-10 may adjust the phase and magnitude of each of signals transmitted and received through multiple antennas or antenna elements. The RF processor may perform a downlink MIMO operation by transmitting one or more layers.

The baseband processor 1o-20 may perform a conversion function between a baseband signal and a bit string according to a physical layer standard of a first radio access technology. For example, during data transmission, the baseband processor 1o-20 may generate complex symbols by encoding and modulating a transmission bit string. In addition, during data reception, the baseband processor 1o-20 may reconstruct a received bit string by demodulating and decoding the baseband signal provided from the RF processor 1o-10. For example, according to an OFDM scheme, during data transmission, the baseband processor 1o-20 may generate complex symbols by encoding and modulating a transmission bit string, may map the complex symbols to subcarriers, and may then configure OFDM symbols through IFFT operation and CP insertion. In addition, during data reception, the baseband processor 1o-20 may divide the baseband signal provided from the RF processor 1o-10 in units of OFDM symbols, may reconstruct signals mapped to the subcarriers through the FFT operation, and may then reconstruct the received bit string through demodulation and decoding. The baseband processor 1o-20 or the RF processor 1o-10 may transmit or receive signals as described above. Accordingly, the baseband processor 1o-20 or the RF processor 1o-10 may be referred to as a transmitter, a receiver, a transceiver, a communication unit, or a wireless communication unit.

The communication unit 1o-30 may provide an interface for communicating with other nodes in a network.

The storage 1o-40 may store data such as a basic program, an application program, and configuration information for the operation of a base station. In particular, the storage 1o-40 may store information on a bearer assigned to a connected UE, a measurement result reported from the connected UE, and the like. In addition, the storage 1o-40 may store information that is a criterion for determining whether to provide or terminate multiple connections to the UE. The storage 1o-40 may provide stored data according to a request from the controller 1o-50.

The controller 1o-50 may control overall operations of the main base station. For example, the controller 1o-50 may transmit or receive signals through the baseband processor 1o-20 or the RF processor 1o-10 or through the communication unit 1o-30. In addition, the controller 1o-50 may record and read data in the storage 1o-40. To this end, the controller 1o-50 may include at least one processor. In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

The embodiments of the disclosure described and shown in the specification and the drawings are merely specific examples that have been presented to easily explain the technical contents of the disclosure and help understanding of the disclosure, and are not intended to limit the scope of the disclosure. That is, it will be apparent to those skilled in the art that other variants based on the technical idea of the disclosure may be implemented. Further, the above respective embodiments may be employed in combination, as necessary. For example, a part of one embodiment of the disclosure may be combined with a part of any other embodiment of the disclosure to operate a base station and a terminal. Further, the above embodiments may be applied to other communication systems, and other variants based on the technical idea of the embodiments may also be implemented. For example, the embodiments may be applied to LTE systems, 5G or NR systems, and the like.

The invention claimed is:

1. A method performed by a transmission device in a wireless communication system, the method comprising:
identifying whether uplink data compression (UDC) is configured by a radio resource control (RRC) message, in case that Ethernet header compression (EHC) is not configured;
in case that the UDC is configured by the RRC message, transmitting, to a reception device, first data compressed based on the UDC;
pre-processing packet data convergence protocol (PDCP) protocol data units (PDUs) based on a UDC buffer;
receiving, from the reception device, an indicator indicating a checks um failure for decompression of the transmitted first data;
initializing the UDC buffer based on the indicator; and
discarding a PDCP data PDU except for a PDCP control PDU among the pre-processed PDCP PDUs based on the indicator.

2. The method of claim 1, further comprising:
discarding at least one of the pre-processed PDCP PDUs for which a PDCP discard timer is not expired, or the pre-processed PDCP PDUs delivered to a lower layer, and
wherein a discard indicator for the PDCP data PDU is submitted to the lower layer.

3. The method of claim 1, further comprising:
compressing second data based on the initialized UDC buffer; and
transmitting, to the reception device, the compressed second data and packet data including a UDC header indicating the initialization of the UDC buffer,
wherein a reordering timer started in the reception device is stopped based on the UDC header.

4. A method performed by a reception device in a wireless communication system, the method comprising:
receiving, from a transmission device, first data;
performing decompression of the first data based on uplink data compression (UDC), wherein the UDC is configured by a radio resource control (RRC) message, in case that Ethernet header compression (EHC) is not configured;
in case that a checksum failure occurs while performing the decompression, transmitting, to the transmission device, an indicator indicating the checksum failure; and
initializing a UDC buffer of the reception device based on the transmission of the indicator,
wherein data which has been pre-processed based on a UDC buffer of the transmission device is discarded in the transmission device based on the indicator, the UDC buffer of the transmission device being applied for generating the first data, and
wherein the discarded data includes a packet data convergence protocol (PDCP) data protocol data unit (PDU) except for a PDCP control PDU among the first data.

5. The method of claim 4,
wherein the discarded data further includes pre-processed data for which a PDCP discard timer is not expired or pre-processed data delivered to a lower layer of the transmission device.

6. The method of claim 4,
wherein initializing of the UDC buffer of the reception device further comprises receiving, from the transmission device, packet data including compressed second data as a response to the transmission of the indicator; identifying whether a UDC header of the compressed second data indicates initialization of the UDC buffer of the transmission device; and initializing the UDC buffer of the reception device in case that the UDC header indicates the initialization of the UDC buffer of the transmission device, and
wherein the method further comprises stopping a reordering timer started in the reception device based on the UDC header indicating the initialization of the UDC buffer of the transmission device.

7. A transmission device in a wireless communication system, the transmission device comprising:
a transceiver; and
a controller configured to:
identify whether uplink data compression (UDC) is configured by a radio resource control (RRC) message, in case that Ethernet header compression (EHC) is not configured,
in case that the UDC is configured by the RRC message, control the transceiver to transmit, to a reception device, first data compressed based on the UDC;
pre-process packet data convergence protocol (PDCP) protocol data units (PDUs) based on a UDC buffer;
control the transceiver to receive, from the reception device, an indicator indicating a checksum failure for decompression of the transmitted first data;
initialize the UDC buffer based on the indicator; and
discard a PDCP data PDU except for a PDCP control PDU among the pre-processed PDCP PDUs based on the indicator.

8. The transmission device of claim 7,
wherein the controller is further configured to discard at least one of the pre-processed PDCP PDUs for which a PDCP discard timer is not expired, or the pre-processed PDCP PDUs delivered to a lower layer, and
wherein a discard indicator for the PDCP data PDU is submitted to the lower layer.

9. The transmission device of claim 7,
wherein the controller is further configured to compress second data based on the initialized UDC buffer; and control the transceiver to transmit, to the reception device, the compressed second data and packet data including a UDC header instructing initialization of the UDC buffer, and
wherein a reordering timer started in the reception device is stopped based on the UDC header.

10. A reception device in a wireless communication system, the reception device comprising:
a transceiver; and
a controller configured to:
control the transceiver to receive, from a transmission device, first data;
perform decompression of the first data based on uplink data compression (UDC), wherein the UDC is configured by a radio resource control (RRC) message, in case that Ethernet header compression (EHC) is not configured;
in case that a checksum failure occurs during performance of the decompression, control the transceiver to transmit, to the transmission device, an indicator indicating the checksum failure; and initialize a UDC buffer of the reception device based on the transmission of the indicator, wherein data which has been pre-processed based on a UDC buffer of the transmission device is discarded in the transmission device based on the indicator, the UDC buffer of the transmission device being applied for generating the first data, and wherein the discarded data includes a packet data convergence protocol (PDCP) data protocol data unit (PDU) except for a PDCP control PDU among the first data.

11. The reception device of claim 10, wherein the controller is further configured to:

control the transceiver to receive, from the transmission device, packet data including compressed second data;

identify whether a UDC header of the compressed second data indicates initialization of the UDC buffer of the transmission device;

in case that the UDC header indicates the initialization of the UDC buffer of the transmission device, initialize the UDC buffer of the reception device; and stop a reordering timer started in the reception device based on the UDC header indicating the initialization of the UDC buffer of the transmission device.

* * * * *